United States Patent
Kim et al.

(10) Patent No.: US 10,411,677 B2
(45) Date of Patent: Sep. 10, 2019

(54) FLIP-FLOP INCLUDING 3-STATE INVERTER

(71) Applicant: SAMSUNG ELECTRONICS CO., LTD., Suwon-si (KR)

(72) Inventors: Ha-Young Kim, Seoul (KR); Dalhee Lee, Seoul (KR); Hyoung-Suk Oh, Seoul (KR); Keunho Lee, Hwaseong-si (KR); Taejoong Song, Seongnam-si (KR); Sungwe Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 15/649,776

(22) Filed: Jul. 14, 2017

(65) Prior Publication Data
US 2018/0019736 A1    Jan. 18, 2018

(30) Foreign Application Priority Data

Jul. 14, 2016    (KR) .................. 10-2016-0089380
May 25, 2017    (KR) .................. 10-2017-0064763

(51) Int. Cl.
*H03K 3/356* (2006.01)
*H03K 23/00* (2006.01)
*H03K 3/3562* (2006.01)

(52) U.S. Cl.
CPC ... *H03K 3/356104* (2013.01); *H03K 3/35625* (2013.01); *H03K 23/001* (2013.01)

(58) Field of Classification Search
None
See application file for complete search history.

(56) References Cited

U.S. PATENT DOCUMENTS

| | | | |
|---|---|---|---|
| 5,612,632 A | 3/1997 | Mahant-Shetti et al. | |
| 6,002,284 A | 12/1999 | Hill et al. | |
| 6,624,667 B2 | 9/2003 | Nii | |
| 8,456,203 B2 * | 6/2013 | Kondou | H03K 23/667 327/113 |
| 8,880,965 B2 | 11/2014 | Zhang et al. | |
| 9,148,149 B2 | 9/2015 | Cheng et al. | |
| 9,331,680 B2 | 5/2016 | Gurumurthy et al. | |
| 9,606,177 B2 * | 3/2017 | Bailey | G01R 31/31727 |
| 2002/0175715 A1 | 11/2002 | Nii | |
| 2013/0147534 A1 * | 6/2013 | Cheng | H03K 3/35625 327/202 |
| 2014/0040688 A1 | 2/2014 | Zhang et al. | |
| 2014/0189453 A1 * | 7/2014 | Gurumurthy | G01R 31/318541 714/727 |
| 2014/0240017 A1 * | 8/2014 | Cheng | H03K 3/35625 327/203 |
| 2014/0285236 A1 | 9/2014 | Cheng et al. | |
| 2015/0042500 A1 * | 2/2015 | Fujiwara | H03M 1/46 341/155 |

(Continued)

*Primary Examiner* — Lincoln D Donovan
*Assistant Examiner* — Khareem E Almo
(74) *Attorney, Agent, or Firm* — Sughrue Mion, PLLC

(57) ABSTRACT

A flip-flop includes an input interface, a first latch, a third inverter, and a second latch. The third inverter and the fifth inverter include first transistors of a first type formed between a first power contact and a second power contact supplied with a power supply voltage on first-type fins, and second transistors of a second type formed between a first ground contact and a second ground contact supplied with a ground voltage on second-type fins.

20 Claims, 17 Drawing Sheets

(56) References Cited

U.S. PATENT DOCUMENTS

| | | | |
|---|---|---|---|
| 2015/0070063 A1 | 3/2015 | Gurumurthy et al. | |
| 2015/0200651 A1* | 7/2015 | Baratam | H03K 3/012 327/202 |
| 2016/0097811 A1 | 4/2016 | Kim et al. | |
| 2016/0142057 A1* | 5/2016 | Melton | H03K 19/09429 326/56 |
| 2016/0164521 A1* | 6/2016 | Chung | H03K 19/017509 326/93 |
| 2016/0248405 A1* | 8/2016 | Bailey | H03K 3/0372 |
| 2016/0254803 A1* | 9/2016 | Kanno | H03K 19/23 327/203 |
| 2017/0359054 A1* | 12/2017 | Hsu | H03K 19/0002 |
| 2018/0143247 A1* | 5/2018 | Lundberg | G01R 31/3177 |

* cited by examiner

FLIP-FLOP INCLUDING 3-STATE INVERTER

CROSS-REFERENCE TO THE RELATED APPLICATIONS

A claim for priority under 35 U.S.C. § 119 is made to Korean Patent Application Nos. 10-2016-0089380 filed Jul. 14, 2016 and 10-2017-0064763 filed May 25, 2017, in the Korean Intellectual Property Office, the disclosures of which are incorporated herein in their entirety by reference.

BACKGROUND

Apparatuses consistent with example embodiments of the inventive concept described herein relate to a semiconductor circuit, and more particularly, relate to a flip-flop including an inverter.

A flip-flop is a semiconductor element that is universally used in various semiconductor circuits. A size of the flip-flop may decrease as a semiconductor process is miniaturized. Semiconductor circuits are manufactured with a Fin Field Effect Transistor (Fin-FET) structure as a Fin-FET-based semiconductor process develops. Accordingly, the flip-flop is also manufactured by using the Fin-FET-based semiconductor process. In a case where the flip-flop is manufactured by using the Fin-FET-based semiconductor process, a design is limited due to an inherent process characteristic of the Fin-FET, thereby causing deterioration in a flip-flop characteristic and a decrease in yield.

SUMMARY

Example embodiments of the inventive concept provide a Fin-FET-based flip-flop capable of preventing deterioration in a characteristic and a decrease in yield. Also, example embodiments of the inventive concept provide a flip-flop having improved efficiency in layout.

According to an aspect of an example embodiment, there is provided a flip-flop which may include: an input interface that receives a first signal and outputs the received first signal as a second signal in synchronization with a clock; a first latch that includes a first inverter and a second inverter and stores the second signal output from the input interface in synchronization with the clock; a third inverter that outputs the second signal stored in the first latch as a third signal in synchronization with the clock; and a second latch that includes a fourth inverter and a fifth inverter and stores the third signal output from the third inverter in synchronization with the clock. The third inverter and the fifth inverter may include first transistors of a first type formed between a first power contact and a second power contact supplied with a power supply voltage on first-type fins, and second transistors of a second type formed between a first ground contact and a second ground contact supplied with a ground voltage on second-type fins.

According to an aspect of an example embodiment, the flip-flop which may include: an input interface that receives a first signal and outputs the received first signal as a second signal in synchronization with a clock; a first latch that includes a first inverter and a second inverter and stores the second signal output from the input unit in synchronization with the clock; a third inverter that outputs the second signal stored in the first latch as a third signal in synchronization with the clock; a second latch that includes a fourth inverter and a fifth inverter and stores the third signal output from the third inverter in synchronization with the clock, and a sixth inverter that inverts the third signal and outputs the inverter signal as a fourth signal. The third inverter may include first and second P-type metal-oxide-semiconductor (PMOS) transistors and first and second N-type metal-oxide-semiconductor (NMOS) transistors. The fifth inverter may include third and fourth PMOS transistors and third and fourth NMOS transistors. The first to fourth PMOS transistors may be disposed between a first power contact and a second power contact supplied with a power supply voltage on first-type fins, and the first to fourth NMOS transistors may be disposed between a first ground contact and a second ground contact supplied with a ground voltage on second-type fins.

According to an aspect of an example embodiment, there is provided a flip-flop which may include: a master latch which includes at least one inverter and is configured to receive an input signal from an input interface; a slave latch which includes at least one inverter including a feedback loop transistor inverter; and a 3-state inverter disposed between the master latch and the slave latch to receive an output signal of the master latch and drive the slave latch with an output signal of the feedback loop transistor inverter. The inverter of the master latch, the feedback loop transistor inverter, and the 3-state inverter may have a same structure of transistors, and controlled by a clock signal and an inverter clock signal which are respectively input to gates of two different-type transistors.

BRIEF DESCRIPTION OF THE FIGURES

The above and other objects and features will become apparent from the following description with reference to the accompanying drawings, wherein like reference numerals refer to like parts throughout the various figures unless otherwise specified, and wherein.

DETAILED DESCRIPTION OF THE EXAMPLE EMBODIMENTS

Below, example embodiments of the inventive concept will be described clearly and in detail with reference to accompanying drawings to such an extent that an ordinarily skilled one in the art implements the example embodiments.

Figure 1:
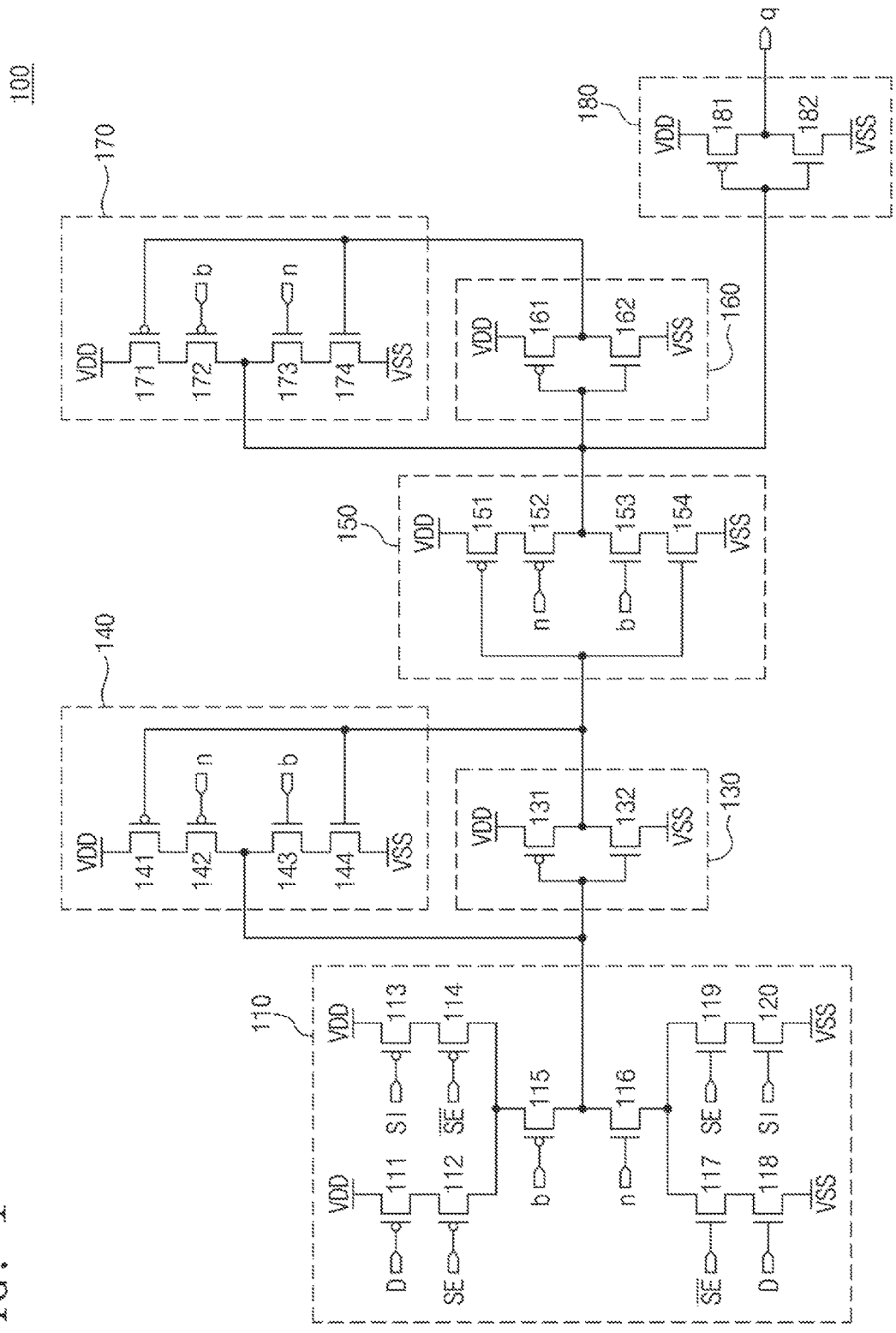
FIG. 1 is a circuit diagram illustrating a flip-flop according to an example embodiment of the inventive concept.

FIG. 1 is a circuit diagram illustrating a flip-flop 100 according to an example embodiment of the inventive concept. Referring to FIG. 1, the flip-flop 100 includes an input interface 110, a first inverter 130, a second inverter 140, a third inverter 150, a fourth inverter 160, a fifth inverter 170, and a sixth inverter 180.

The input interface 110 includes first to tenth transistors 111 to 120. The first and second input transistors 111 and 112 are connected in series between a power node, to which a power supply voltage VDD is supplied, and the fifth transistor 115. The first and second input transistors 111 and 112 may be P-type transistors. An input signal D may be transferred to a gate of the first input transistor 111, and a scan enable signal SE may be transferred to a gate of the second input transistor 112.

The third and fourth input transistors 113 and 114 are connected in series between the power node and the fifth input transistor 115. The third and fourth input transistors 113 and 114 may be connected in parallel with the first and second input transistors 111 and 112 between the fifth input transistor 115 and the power node. The third and fourth input transistors 113 and 114 may be P-type transistors. A scan input signal SI may be transferred to a gate of the third input transistor 113, and a scan enable bar signal $\overline{SE}$ may be transferred to a gate of the fourth input transistor 114.

The fifth and sixth input transistors 115 and 116 are connected in series between the second and fourth input transistors 112 and 114 and the seventh and ninth input transistors 117 and 119. The fifth input transistor 115 may be a P-type transistor. The sixth input transistor 116 may be an N-type transistor. A second clock signal b may be transferred to a gate of the fifth input transistor 115, and a first clock signal n may be transferred to a gate of the sixth input transistor 116.

The seventh and eighth input transistors 117 and 118 are connected in series between a ground node, to which a ground voltage VSS is supplied, and the sixth input transistor 116. The seventh and eighth input transistors 117 and 118 may be N-type transistors. The scan enable bar signal $\overline{SE}$ may be transferred to a gate of the seventh input transistor 117, and the input signal D may be transferred to a gate of the eighth input transistor 118.

The ninth and tenth input transistors 119 and 120 are connected in series between the ground node and the sixth input transistor 116. The ninth and tenth input transistors 119 and 120 may be connected in parallel with the seventh and eighth input transistors 117 and 118 between the sixth input transistor 116 and the ground node. The ninth and tenth input transistors 119 and 120 may be N-type transistors. The scan enable signal SE may be transferred to a gate of the ninth input transistor 119, and the scan input signal SI may be transferred to a gate of the tenth input transistor 120.

A node between the fifth and sixth input transistors 115 and 116 may be an output of the input interface 110. The output of the input interface 110 is connected to an input of the first inverter 130 and an output of the second inverter 140.

The input interface 110 may operate in a first mode and a second mode. In the first mode, the scan enable signal SE may be deactivated. For example, the scan enable signal SE may have the ground voltage VSS or a voltage lower than the ground voltage VSS. In this case, the second and seventh input transistors 112 and 117 are turned on, and the fourth and ninth input transistors 114 and 119 are turned off. The input interface 110 may block the scan input signal SI, and may output the input signal D (or an inverted version of the input signal D) to the first inverter 130 in synchronization with the first and second clock signals n and b.

In the second mode, the scan enable signal SE may be activated. For example, the scan enable signal SE may have the power supply voltage VDD or a voltage similar to the power supply voltage VDD. In this case, the second and seventh input transistors 112 and 117 are turned off, and the fourth and ninth input transistors 114 and 119 are turned on. The input interface 110 may block the input signal D, and may output the scan input signal SI (or an inverted version of the scan input signal SI) to the first inverter 130 in synchronization with the first and second clock signals n and b.

In an example embodiment, the scan input signal SI may be used for a special purpose such as a scan test. The input signal D may be used for an original design purpose of a semiconductor circuit including the flip-flop 100.

The first inverter 130 inverts an output signal of the input interface 110, and transfers the inverted output signal to the second inverter 140 and the third inverter 150. The first inverter 130 includes a 1_1th transistor 131 and a 1_2nd transistor 132. The 1_1st and 1_2nd input transistors 131 and 132 are connected in series between the power node and the ground node. Gates of the 1_1st and 1_2nd input transistors 131 and 132 are connected to the output of the input interface 110 and the output of the second inverter 140. A node between the 1_1st and 1_2nd input transistors 131 and 132 may be the output of the first inverter 130. The output of the first inverter 130 is connected to inputs of the second inverter 140 and the third inverter 150.

The second inverter 140 inverts an output signal of the first inverter 130 and transfers the inverted output signal to the first inverter 130. The second inverter 140 includes 2_1st to 2_4th transistors 141 to 144. The 2_1st to 2_4th transistors 141 to 144 are connected in series between the power node and the ground node. The output signal of the first inverter 130 is transferred to gates of the 2_1st and 2_4th transistors 141 and 144. The first clock signal n is transferred to a gate of the 2_2nd transistor 142. The second clock signal b is transferred to a gate of the 2_3rd transistor 143. The second inverter 140 may be a 3-state inverter that operates in synchronization with the first and second clock signals n and b. A node between the 2_2nd and 2_3rd transistors 142 and 143 may be the output of the second inverter 140. The output of the second inverter 140 is connected to the input of the first inverter 130.

The first and second inverters 130 and 140 may constitute a master latch of the flip-flop 100.

The third inverter 150 inverts the output signal of the first inverter 130, and transfers the inverted output signal to the fourth inverter 160. The third inverter 150 includes 3_1st to 3_4th transistors 151 to 154. The 3_1st to 3_4th transistors 151 to 154 are connected in series between the power node and the ground node. The output signal of the first inverter 130 is transferred to gates of the 3_1st and 3_4th transistors 151 and 154. The first clock signal n is transferred to a gate of the 3_2nd transistor 152. The second clock signal b is transferred to a gate of the 3_3rd transistor 153. The third inverter 150 may be a 3-state inverter that operates in synchronization with the first and second clock signals n and b. A node between the 3_2nd and 3_3rd transistors 152 and 153 may be an output of the third inverter 150. The output of the third inverter 150 is connected to an input of the fourth inverter 160.

The fourth inverter 160 inverts an output signal of the third inverter 150, and transfers the inverted output signal to the fifth inverter 170. The fourth inverter 160 includes a 4_1th transistor 161 and a 4_2nd transistor 162. The 4_1st and 4_2nd input transistors 161 and 162 are connected in series between the power node and the ground node. Gates of the 4_1st and 4_2nd input transistors 161 and 162 are connected to the output of the third inverter 150 and an output of the fifth inverter 170. A node between the 4_1st and 4_2nd input transistors 161 and 162 may be the output of the fourth inverter 160. The output of the fourth inverter 160 is connected to inputs of the fifth inverter 170.

The fifth inverter 170 inverts an output signal of the fourth inverter 160, and transfers the inverted output signal to the fourth inverter 160. The fifth inverter 170 includes 5_1st to 5_4th transistors 171 to 174. The 5_1st to 4_4th transistors 171 to 174 are connected in series between the power node and the ground node. The output signal of the fourth inverter 160 is transferred to gates of the 5_1st and 5_4th transistors 171 and 174. The second clock signal b is transferred to a gate of the 5_2nd transistor 172. The first clock signal n is transferred to a gate of the 5_3rd transistor 173. The fifth inverter 170 may be a 3-state inverter that operates in synchronization with the first and second clock signals n and b. A node between the 5_2nd and 5_3rd input transistors 172 and 173 may be an output of the fifth inverter 170. The output of the fifth inverter 170 is connected to the input of the fourth inverter 160.

The fourth and fifth inverters 160 and 170 may constitute a slave latch of the flip-flop 100.

The sixth inverter 180 inverts the output signal of the third inverter 150, and transfers the inverted output signal as an output signal q. The sixth inverter 180 includes a 6_1th transistor 181 and a 6_2nd transistor 182. The 6_1st and 6_2nd transistors 181 and 182 are connected in series between the power node and the ground node. Gates of the 6_1st and 6_2nd transistors 181 and 182 are connected to the output of the third inverter 150 and the output of the fifth inverter 170. A node between the 6_1st and 6_2nd transistors 181 and 182 may be the output of the sixth inverter 180.

According to an example embodiment of the inventive concept, a signal transfer between the master latch including the first and second inverters 130 and 140 and the slave latch including the fourth and fifth inverters 160 and 170 is performed by the third inverter 150.

In general, to reduce the number of transistors, a signal transfer between a master latch and a slave latch of a flip-flop is performed by a transmission gate that operates in synchronization with clock signals. In this case, to prevent an error (i.e., a back flow of a signal) that a signal of the master latch is changed by a signal of the slave latch, there is used a sizing technology for making the sizes of the 1_1st and 1_2nd transistors 131 and 132 of the first invert 130 of the master latch larger than the sizes of the 5_1st to 5_4th of the fifth inverter 170 of the slave latch. However, the sizing technology in the Fin-FET process makes the number of fins used in transistors different from each other, thereby causing a taper. The taper causes deterioration in a flip-flop characteristic and a decrease in yield.

To prevent the above-described issues, the flip-flop 100 according to an example embodiment of the inventive concept uses the third inverter 150 for a signal transfer between the master latch and the slave latch. Accordingly, a back flow of a signal is prevented. Also, since there is no need to use the sizing technology, it is possible to prevent occurrence of the taper.

The flip-flop 100 according to an example embodiment of the inventive concept provides a layout that allows improvement of layout efficiency of the flip-flop 100 including the third inverter 150. Accordingly, even though the number of transistors increases due to the third inverter 150, the overall size of the flip-flop 100 is prevented from increasing.

Figure 2:
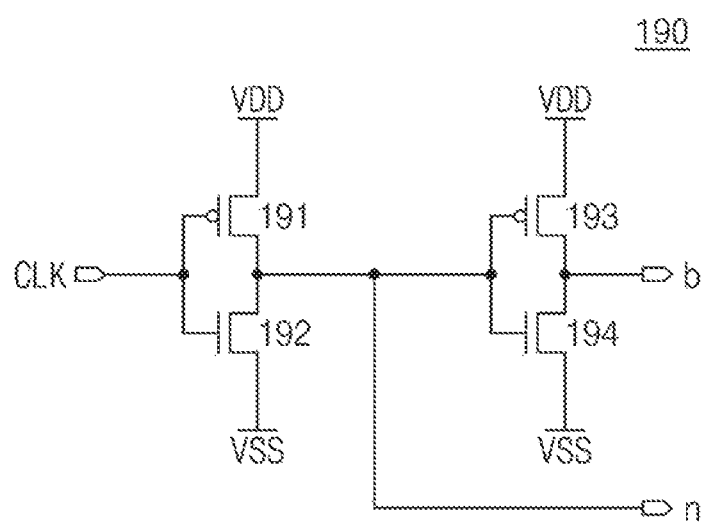
FIG. 2 illustrates an example of a clock generator that supplies first and second clock signals to the flip-flop of FIG. 1.

FIG. 2 illustrates an example of a clock generator 190 that supplies the first and second clock signals n and b to the flip-flop 100 of FIG. 1. Referring to FIG. 2, the clock generator 190 includes first to fourth transistors 191 to 194. The first and second transistors 191 and 192 are connected in series between the power node and the ground node. The third and fourth transistors 193 and 194 are connected in series between the power node and the ground node. The first and third transistors 191 and 193 may be P-type transistors, and the second and fourth transistors 192 and 194 may be N-type transistors.

The first and second transistors 191 and 192 may constitute an inverter. The first and second inverts 191 and 192 may invert a clock signal CLK to output the first clock signal n. The clock signal CLK may be a clock signal used in a semiconductor circuit including the flip-flop 100. The third and fourth transistors 193 and 194 may constitute an inverter. The third and fourth inverts 193 and 194 may invert the first clock signal n to output the second clock signal b.

Figure 3:
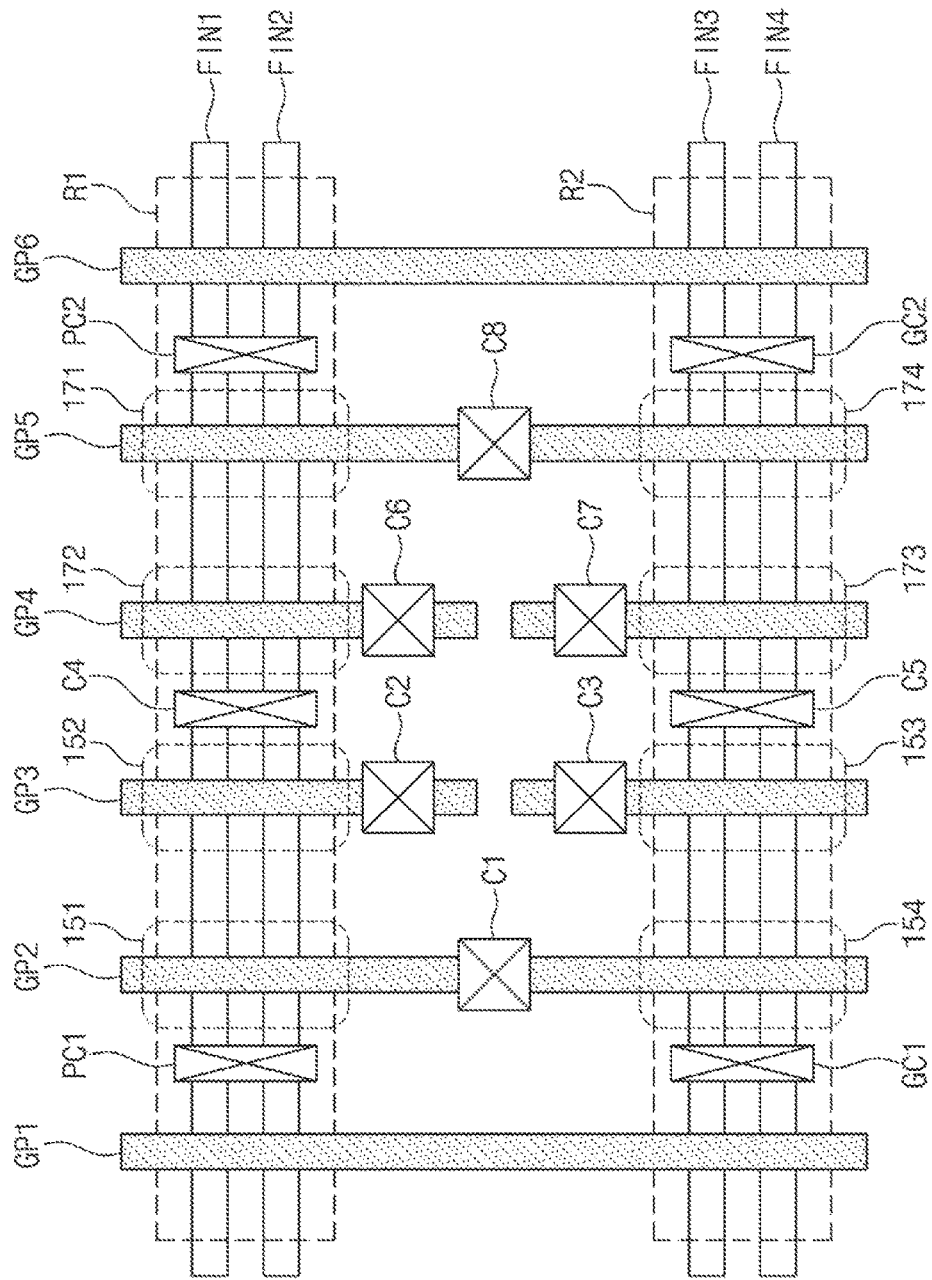
FIG. 3 illustrates an example of a layout in which a third inverter and a fifth inverter are implemented with a Fin-FET structure.

FIG. 3 illustrates an example of a layout in which the third inverter 150 and the fifth inverter 170 are implemented with a Fin-FET structure. Referring to FIGS. 1 and 3, the third and fifth inverters 150 and 170 may be formed in first to fourth fins FIN1 to FIN4. The first to fourth fins FIN1 to FIN4 may be disposed in parallel with one another. The first and second fins FIN1 and FIN2 may form a first active area R1 of a P-type. The third and fourth fins FIN3 and FIN4 may form a second active area R2 of an N-type.

First to sixth gate patters GP1 to GP6 may be disposed on the first to fourth fins FIN1 to FIN4. The first to sixth gate patterns GP1 to GP6 may be disposed in parallel with one another. The first to sixth gate patters GP1 to GP6 may be disposed perpendicular to the first to fourth fins FIN1 to FIN4.

A first power contact PC1 may be provided between the first and second gate patterns GP1 and GP2 in the first active area R1. A second power contact PC2 may be provided between the fifth and sixth gate patterns GP5 and GP6 in the first active area R1. The first and second power contacts PC1 and PC2 may extend in a direction perpendicular to the first active area R1, and may be connected with a wiring over the first and second active areas R1 and R2. The first power contact PC1 may supply the power supply voltage VDD to a node (e.g., a source or a drain) of the 3_1st transistor 151. The second power contact PC2 may supply the power supply voltage VDD to a node (e.g., a source or a drain) of the 5_1st transistor 171.

A first ground contact GC1 may be provided between the first and second gate patterns GP1 and GP2 in the second active area R2. A second ground contact GC2 may be provided between the fifth and sixth gate patterns GP5 and GP6 in the second active area R2. The first and second ground contacts GC1 and GC2 may extend in a direction perpendicular to the second active area R2, and may be connected with a wiring over the first and second active areas R1 and R2. The first ground contact GC1 may supply the ground voltage VSS to a node (e.g., a source or a drain) of the 3_4th transistor 154. The second ground contact GC2 may supply the ground voltage VSS to a node (e.g., a source or a drain) of the 5_4th transistor 174.

In the first active area R1, the second gate pattern GP2 may form the 3_1st transistor 151 together with portions of the first active area R1 which are adjacent to the second gate pattern GP2. In the first active area R1, the third gate pattern GP3 may form the 3_2nd transistor 152 together with portions of the first active area R1 which are adjacent to the third gate pattern GP3. The 3_1st and 3_2nd transistors 151 and 152 may be connected in series to each other.

In the second active area R2, the second gate pattern GP2 may form the 3_4th transistor 154 together with portions of the second active area R2 which are adjacent to the second gate pattern GP2. In the second active area R2, the third gate pattern GP3 may form the 3_3rd transistor 153 together with portions of the second active area R2 which are adjacent to the third gate pattern GP3. The 3_3rd and 3_4th transistors 153 and 154 may be connected in series to each other.

A first contact C1 may be provided in the second gate pattern GP2 of the 3_1st and 3_4th transistors 151 and 154. The first contact C1 may extend in a direction perpendicular to the first and second active areas R1 and R2, and may be connected with a wiring over the first and second active areas R1 and R2. The first contact C1 may be electrically connected with an output of the first inverter 130 and an input of the second inverter 140.

The third gate pattern GP3 may be divided into a first portion corresponding to the first active area R1 and a second portion corresponding to the second active area R2. A second contact C2 is provided in the first portion of the third gate pattern GP3. The second contact C2 may extend in a direction perpendicular to the first and second active areas R1 and R2, and may be connected with a wiring over the first and second active areas R1 and R2. The second contact C2 may supply the first clock signal n to the first portion of the third gate pattern GP3.

A third contact C3 is provided in the second portion of the third gate pattern GP3. The third contact C3 may extend in a direction perpendicular to the first and second active areas R1 and R2, and may be connected with a wiring over the first and second active areas R1 and R2. The third contact C3 may supply the second clock signal b to the second portion of the third gate pattern GP3.

In the first active area R1, a fourth contact C4 may be provided between the third and fourth gate patterns GP3 and GP4. In the second active area R2, a fifth contact C5 may be provided between the third and fourth gate patterns GP3 and GP4. The fourth and fifth contacts C4 and C5 may extend in a direction perpendicular to the first and second active areas R1 and R2, and may be connected in common over the first and second active areas R1 and R2. Since the fourth and fifth contacts C4 and C5 are connected in common to each other, the 3_1st to 3_4th transistors 151 to 154 may be connected in series between the first power contact PC1 supplied with the power supply voltage VDD and the first ground contact GC1 supplied with the ground voltage VSS. The fourth and fifth contacts C4 and C5 may be electrically connected with inputs of the fourth and sixth inverters 160 and 180.

In the first active area R1, the fifth gate pattern GP5 may form the 5_1st transistor 171 together with portions of the first active area R1 which are adjacent to the fifth gate pattern GP5. In the first active area R1, the fourth gate pattern GP4 may form the 5_2nd transistor 172 together with portions of the first active area R1 which are adjacent to the fourth gate pattern GP4. The 5_1st and 5_2nd transistors 171 and 172 may be connected in series to each other.

In the second active area R2, the fifth gate pattern GP5 may form the 5_4th transistor 174 together with portions of the second active area R2, which are adjacent to the fifth gate pattern GP5. In the second active area R2, the fourth gate pattern GP4 may form the 5_3rd transistor 173 together with portions of the second active area R2 which are adjacent to the fourth gate pattern GP4. The 5_3rd and 5_4th transistors 173 and 174 may be connected in series to each other.

An eighth contact C8 may be provided in the fifth gate pattern GP5 of the 5_1st and 5_4th transistors 171 and 174. The eighth contact C8 may extend in a direction perpendicular to the first and second active areas R1 and R2, and may be connected with a wiring over the first and second active areas R1 and R2. The eighth contact C8 may be electrically connected with an input of the fifth inverter 170.

The fourth gate pattern GP4 may be divided into a first portion corresponding to the first active area R1 and a second portion corresponding to the second active area R2. A sixth contact C6 is provided in the first portion of the fourth gate pattern GP4. The sixth contact C6 may extend in a direction perpendicular to the first and second active areas R1 and R2, and may be connected with a wiring over the first and second active areas R1 and R2. The sixth contact C6 may supply the second clock signal b to the first portion of the fourth gate pattern GP4.

A seventh contact C7 is provided in the second portion of the fourth gate pattern GP4. The seventh contact C7 may extend in a direction perpendicular to the first and second active areas R1 and R2, and may be connected with a wiring over the first and second active areas R1 and R2. The seventh contact C7 may supply the first clock signal n to the second portion of the fourth gate pattern GP4.

Since the fourth and fifth contacts C4 and C5 are connected in common to each other, the 5_1st to 5_4th transistors 171 to 174 may be connected in series between the second power contact PC2 supplied with the power supply voltage VDD and the second ground contact GC2 supplied with the ground voltage VSS.

According to the layout of FIG. 3, the third inverter 150 and the fifth inverter 170 are implemented with the transistors 151, 152, 171 and 172 which are formed between the first power contact PC1 and the second power contact PC2 supplied with the power supply voltage VDD over the first and second fins FIN1 and FIN2 forming the first active area R1 of the P-type, and the transistors 153, 154, 173 and 174 which are formed between the first ground contact GC1 and the second ground contact GC2 supplied with the ground voltage VSS over the third and fourth fins FIN3 and FIN4 forming the second active area R2 of the N-type.

The first and second power contacts PC1 and PC2 and the first and second ground contacts GC1 and GC2 may be disposed around the layout of the third and fifth inverters 150 and 170. Accordingly, the power supply voltage VDD and the ground voltage VSS are supplied to the first gate pattern GP1 and the sixth gate pattern GP6 through the first and second power contacts PC1 and PC2 and the first and second ground contacts GC1 and GC2. That is, any other element that needs the power supply voltage VDD or the ground voltage VSS may be disposed to share the power supply voltage VDD and the ground voltage VSS supplied through the first power contacts PC1 and PC2 and the first and second ground contacts GC1 and GC2 with the third and fifth inverters 150 and 170. Accordingly, the layout efficiency of the flip-flop including the third and fifth inverters 150 and 170 may increase, and the size of the flip-flop 100 may decrease.

Figure 4:
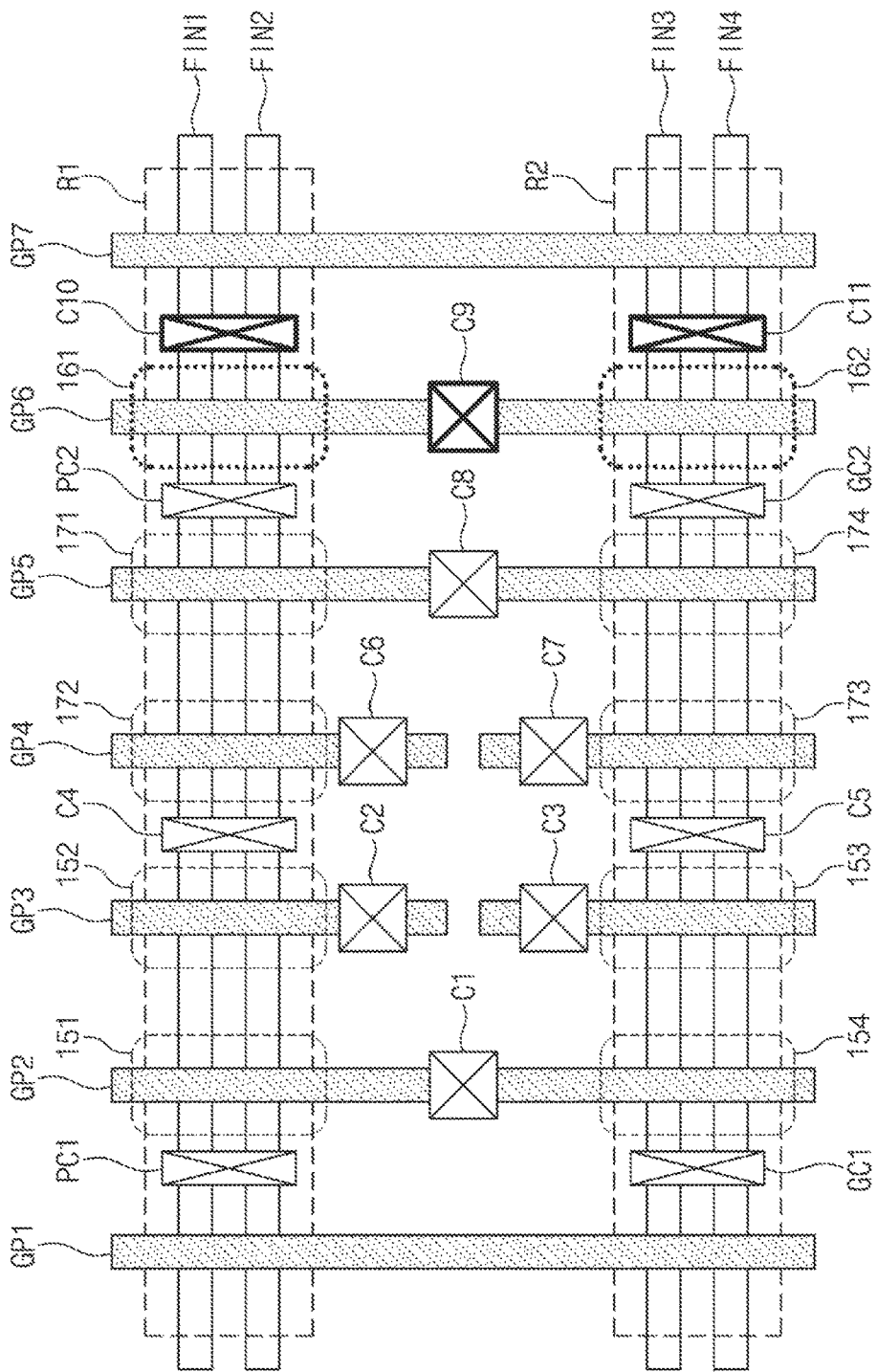
FIG. 4 illustrates an example in which a fourth inverter shares a power supply voltage and a ground voltage of the third and fifth inverters of FIG. 3.

FIG. 4 illustrates an example in which the fourth inverter 160 shares the power supply voltage VDD and the ground voltage VSS of the third and fifth inverters 150 and 170 of FIG. 3. In FIG. 4, configurations associated with the 3_1st to 3_4th transistors 151 to 154 and the 5_1st to 5_4th transistors 171 to 174 are the same as illustrated in FIG. 3, and a description thereof is thus omitted. Compared with FIG. 3, a seventh gate pattern GP7 is added in FIG. 4.

Referring to FIGS. 1 and 4, the sixth gate pattern GP6 may form the 4_1st transistor 161 together with portions of the first active area R1 which are adjacent to the sixth gate pattern GP6. The sixth gate pattern GP6 may form the 4_2nd transistor 162 together with portions of the second active area R2 which are adjacent to the sixth gate pattern GP6. A ninth contact C9 may be provided in the sixth gate pattern GP6 of the 4_1st and 4_2nd transistors 161 and 162. The ninth contact C9 may extend in a direction perpendicular to the first and second active areas R1 and R2, and may be connected with a wiring over the first and second active areas R1 and R2. The ninth contact C9 may be electrically connected with an input of the fourth inverter 160. The ninth contact C9 may be electrically connected with the fourth and fifth contacts C4 and C5 that correspond to an output of the third inverter 150.

In the first active area R1, a tenth contact C10 may be provided between the sixth and seventh gate patterns GP6 and GP7. In the second active area R2, an eleventh contact C11 may be provided between the sixth and seventh gate patterns GP6 and GP7. The tenth and eleventh contacts C10 and C11 may extend in a direction perpendicular to the first and second active areas R1 and R2, and may be connected in common over the first and second active areas R1 and R2. Since the tenth and eleventh contacts C10 and C11 are connected in common to each other, the 4_1st and 4_2nd transistors 161 and 162 may be connected in series between the second power contact PC2 supplied with the power supply voltage VDD and the second ground contact GC2 supplied with the ground voltage VSS. The tenth and eleventh contacts C10 and C11 may correspond to an output of the fourth inverter 160. The tenth and eleventh contacts C10 and C11 may be electrically connected with the eighth contact C8.

As illustrated in FIG. 4, the fourth inverter 160 may be disposed to share the second power contact PC2 supplied with the power supply voltage VDD and the second ground contact GC2 supplied with the ground voltage VSS with the fifth inverter 170. According to the above-described layout, power contacts and ground contacts to be disposed upon implementing the flip-flop 100 decrease in number. Accordingly, the size of the flip-flop 100 is reduced.

In an example embodiment, the fourth inverter 160 is illustrated in FIG. 4 as sharing the power supply voltage VDD and the ground voltage VSS with the fifth inverter 170. However, the fourth inverter 160 may be disposed to share the power supply voltage VDD and the ground voltage VSS with the third inverter 150. For example, the first gate pattern GP1 may be used as gates of the 4_1st and 4_2nd transistors 161 and 162. The ninth contact C9 may be disposed on the first gate pattern GP1. The tenth and eleventh contacts C10 and C11 may be disposed on left side of the first gate pattern GP1.

In an example embodiment, the fourth inverter 160 is illustrated in FIG. 4 as sharing the power supply voltage VDD and the ground voltage VSS with the fifth inverter 170. However, instead of the fourth inverter 160, the sixth inverter 180 may share the power supply voltage VDD and the ground voltage VSS with the fifth inverter 170. For example, the sixth gate pattern GP6 may form the 6_1st transistor 181 together with portions of the first active area R1 which are adjacent to the sixth gate pattern GP6, and may form the 6_2nd transistor 182 together with portions of the second active area R2 which are adjacent to the sixth gate pattern GP6.

In an example embodiment, the fourth inverter 160 may be disposed to share the power supply voltage VDD and the ground voltage VSS with the fifth inverter 170 or the third inverter 150, and the sixth inverter 180 may be disposed to share the power supply voltage VDD and the ground voltage VSS with the third inverter 150 or the fifth inverter 170.

Figure 5:
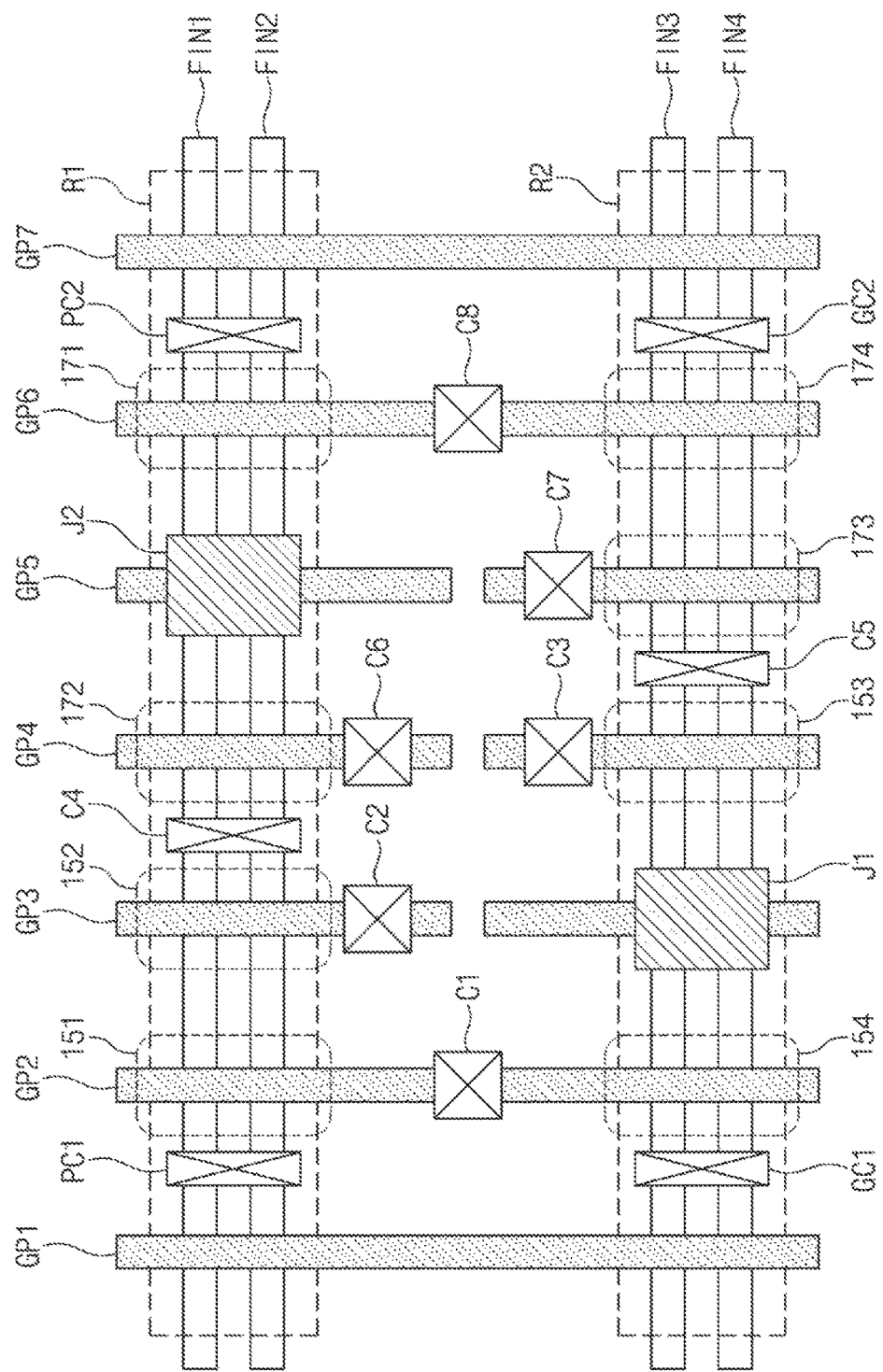
FIG. 5 illustrates an application example of arrangement of the third and fifth inverters.

FIG. 5 illustrates an application example of arrangement of the third and fifth inverters 150 and 170. The third and fourth gate patterns GP3 and GP4 of FIG. 3 may be replaced with the third to fifth gate patterns GP3 to GP5 of FIG. 4. The fifth and sixth gate patterns GP5 and GP6 of FIG. 3 may correspond to the sixth and seventh gate patterns GP6 and GP7 of FIG. 5.

Referring to FIGS. 1 and 5, each of the third to fifth gate patterns GP3 to GP5 may be divided into a first portion corresponding to the first active area R1 and a second portion corresponding to the second active area R2.

The third gate pattern GP3 may form the 3_2nd transistor 152 together with portions of the first active area R1 which are adjacent to the third gate pattern GP3. The second portion of the third gate pattern GP3 may be ignored by a first jumper J1. The first jumper J1 may electrically connect portions of the second active area R2 which are separated by the second portion of the third gate pattern GP3.

The first portion of the fourth gate pattern GP4 may form the 5_2nd transistor 172 together with portions of the first active area R1 which are adjacent to the first portion of the fourth gate pattern GP4. The second portion of the fourth gate pattern GP4 may form the 3_3rd transistor 153 together with portions of the second active area R2 which are adjacent to the second portion of the fourth gate pattern GP4.

The first portion of the fifth gate pattern GP5 may be ignored by a second jumper J2. The second jumper J2 may electrically connect portions of the first active area R1 which are separated by the first portion of the fifth gate pattern GP5. The second portion of the fifth gate pattern GP5 may form the 5_3rd transistor 173 together with portions of the second active area R2 which are adjacent to the second portion of the fifth gate pattern GP5.

Figure 6:
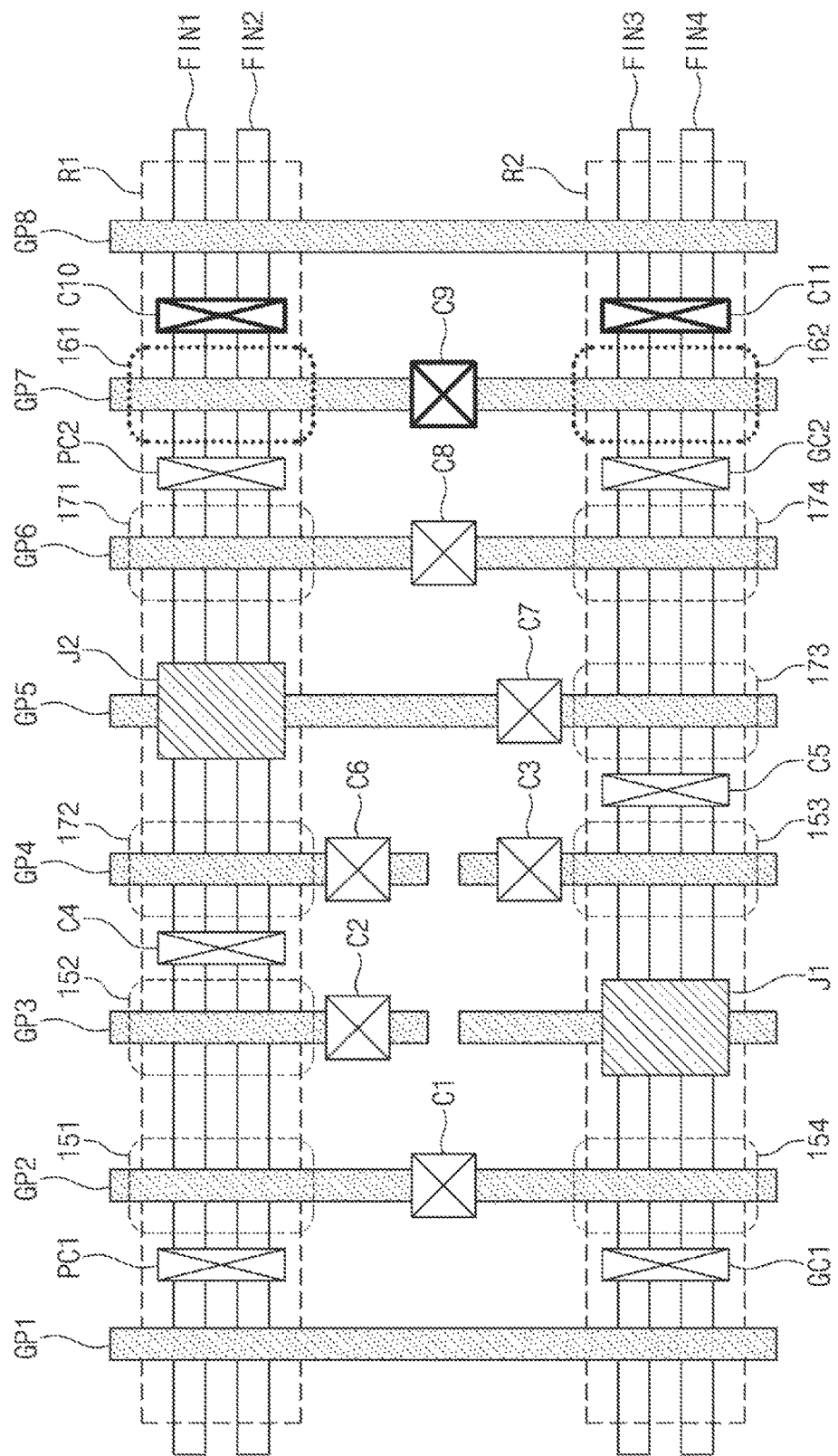
FIG. 6 illustrates an example in which the power supply voltage and the ground voltage of the third and fifth inverters of FIG. 5 are shared.

FIG. 6 illustrates an example in which the power supply voltage VDD and the ground voltage VSS of the third and fifth inverters 150 and 170 of FIG. 5 are shared. In an example embodiment, the fourth inverter 160 or the sixth inverter 180 may share the power supply voltage VDD and the ground voltage VSS with the third and fifth inverters 150 and 170.

The arrangement of the 3_1st to 3_4th transistors 151 to 154 and the 5_1st to 5_4th transistors 171 to 174 may be the same as illustrated in FIG. 5. Compared with FIG. 5, an eighth gate pattern GP8 is added in FIG. 6.

The seventh gate pattern GP7 may correspond to the sixth gate pattern GP6 of FIG. 4. For example, the seventh gate pattern GP7 may form the 4_1st transistor 161 together with portions of the first active area R1 which are adjacent to the seventh gate pattern GP7, and may form the 4_2nd transistor 162 together with portions of the second active area R2 which are adjacent to the seventh gate pattern GP7.

The fourth inverter 160 illustrated in FIG. 6 is an example. As described with reference to FIG. 4, the fourth inverter 160 or the sixth inverter 180 may be disposed to share the power supply voltage VDD and the ground voltage VSS with the third inverter 150 or the fifth inverter 170.

Figure 7:
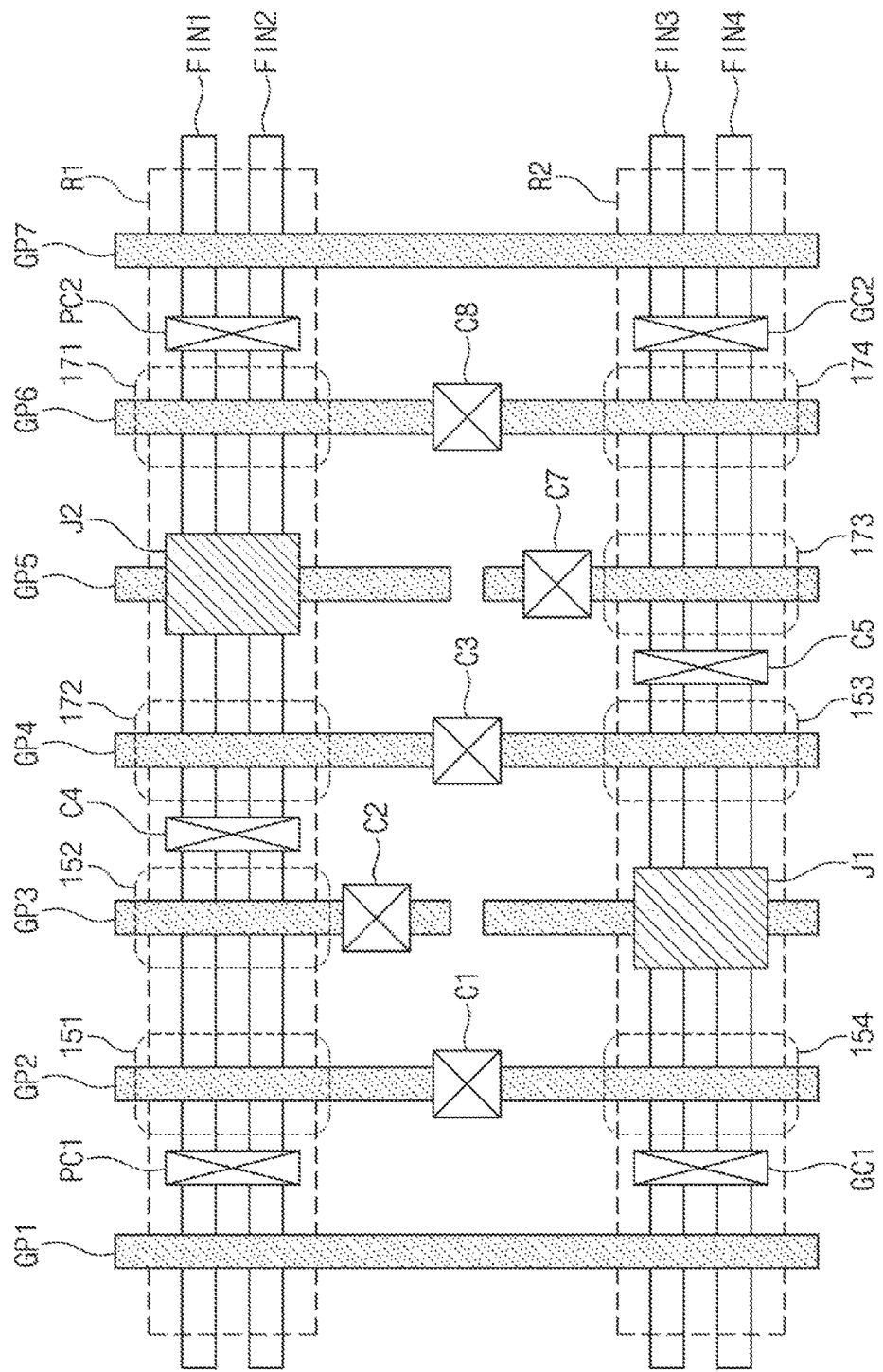
FIG. 7 illustrates an application example of the third and fifth inverters of FIG. 5.

FIG. 7 illustrates an application example of the third and fifth inverters 150 and 170 of FIG. 5. Compared with FIG. 5, the fourth gate pattern GP4 of FIG. 7 may not be separated into a first portion and a second portion. The fourth gate pattern GP4 may form the 5_2nd transistor 172 together with portions of the first active area R1 which are adjacent to the fourth gate pattern GP4, and may form the 3_3rd transistor 153 together with portions of the second active area R2 which are adjacent to the fourth gate pattern GP4.

In FIG. 5, the sixth contact C6 disposed in the first portion of the fourth gate GP4 supplies the second clock signal b, and the third contact C3 disposed in the second portion of the fourth gate pattern GP4 supplies the second clock signal b. Since the third and sixth contacts C3 and C6 transfer the same signal, one of the third and sixth contacts C3 and C6 may be removed without separating the fourth gate pattern GP4.

Figure 8:
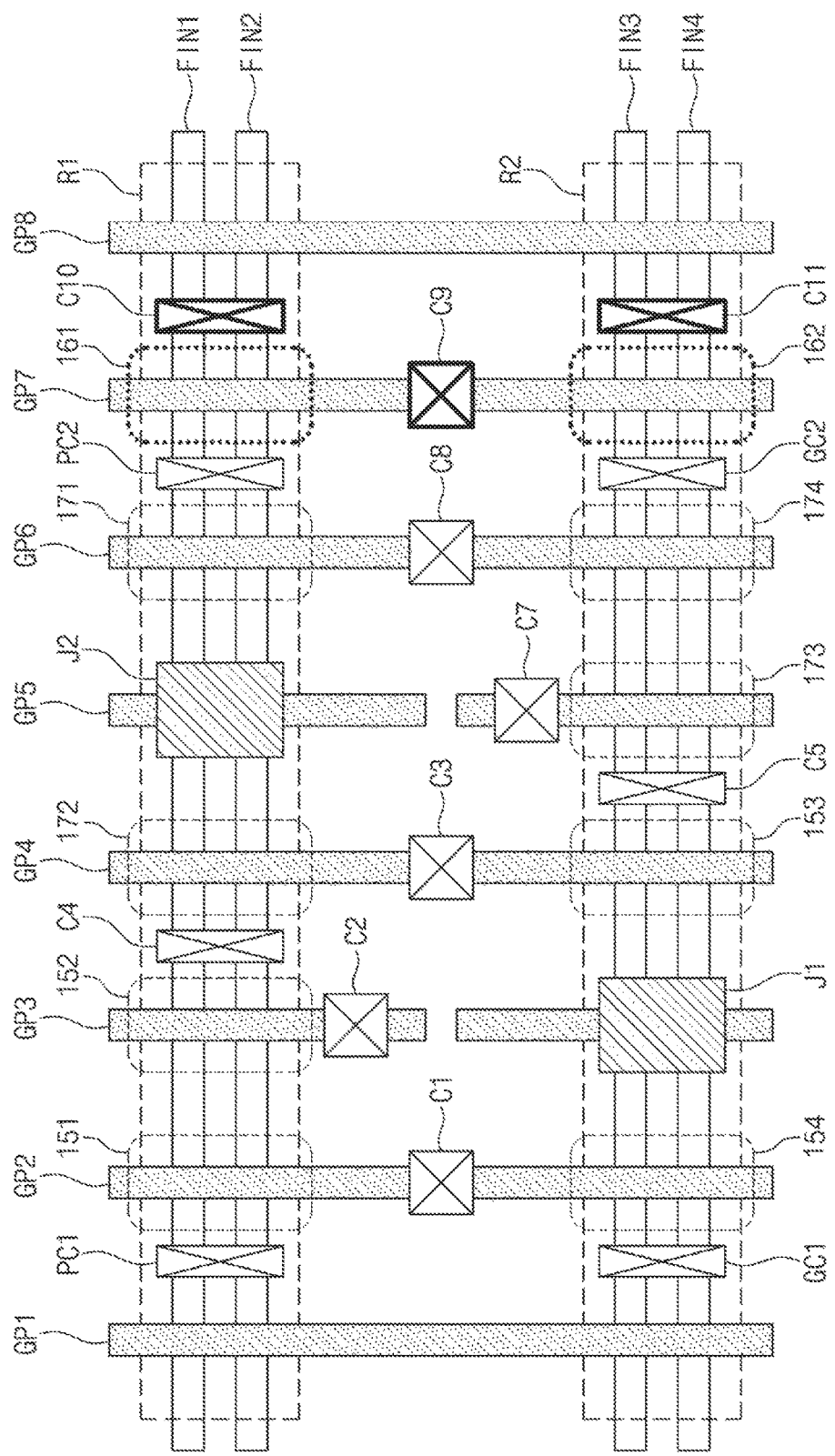
FIG. 8 illustrates an example in which the power supply voltage and the ground voltage of the third and fifth inverters of FIG. 7 are shared.

FIG. 8 illustrates an example in which the power supply voltage VDD and the ground voltage VSS of the third and fifth inverters 150 and 170 of FIG. 7 are shared. In an example embodiment, the fourth inverter 160 or the sixth inverter 180 may share the power supply voltage VDD and the ground voltage VSS with the third and fifth inverter 150 and 170.

The arrangement of the 3_1st to 3_4th transistors 151 to 154 and the 5_1st to 5_4th transistors 171 to 174 may be the same as illustrated in FIG. 7. Compared with FIG. 7, the eighth gate pattern GP8 is added in FIG. 8.

The seventh gate pattern GP7 may correspond to the sixth gate pattern GP6 of FIG. 4. For example, the seventh gate pattern GP7 may form the 4_1st transistor 161 together with portions of the first active area R1 which are adjacent to the seventh gate pattern GP7, and may form the 4_2nd transistor 162 together with portions of the second active area R2 which are adjacent to the seventh gate pattern GP7.

The fourth inverter 160 illustrated in FIG. 8 is an example. As described with reference to FIG. 4, the fourth inverter 160 or the sixth inverter 180 may be disposed to share the power supply voltage VDD and the ground voltage VSS with the third inverter 150 or the fifth inverter 170.

Figure 9:
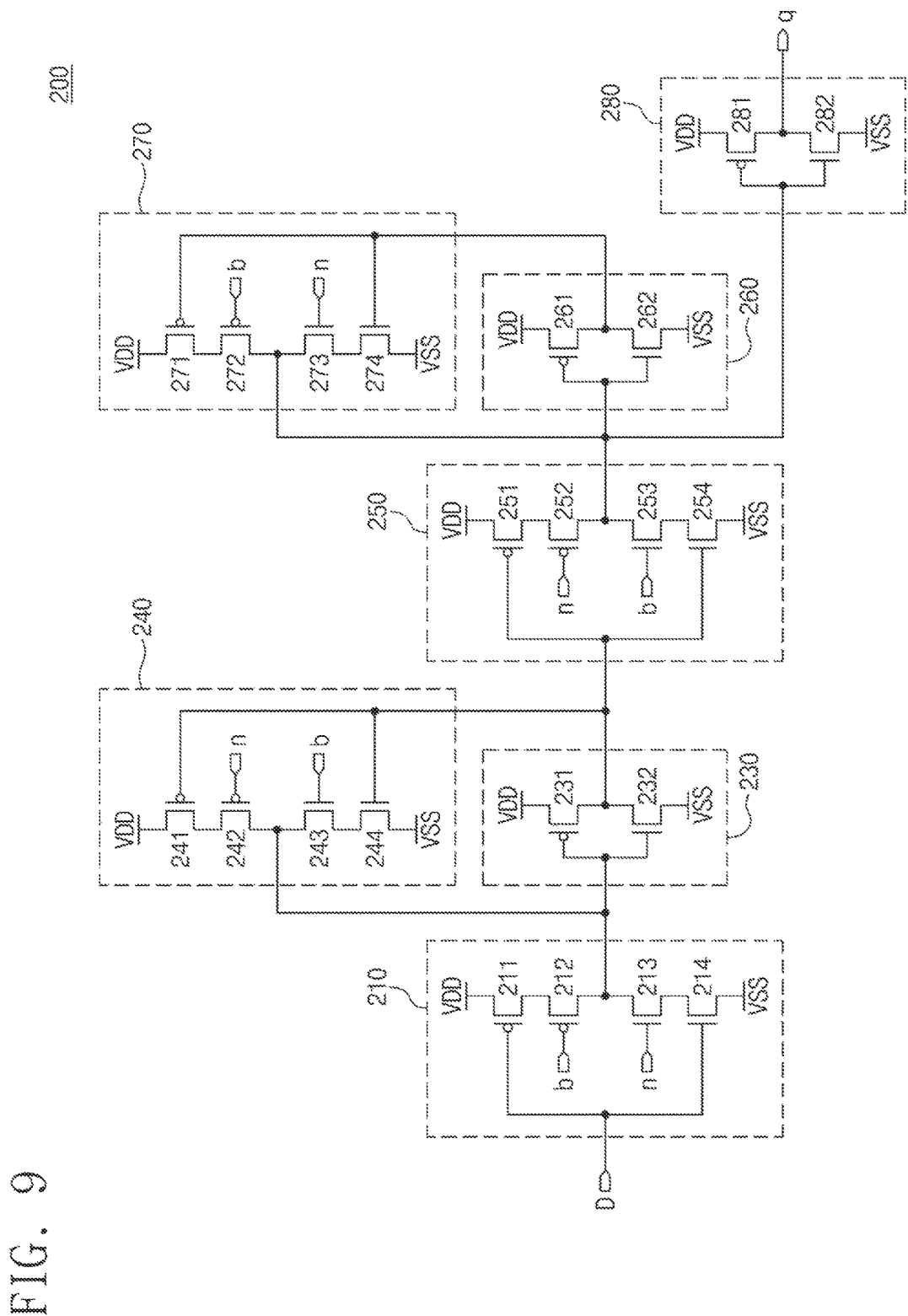
FIG. 9 illustrates an application example of the flip-flop of FIG. 1.

FIG. 9 illustrates an application example of the flip-flop 100 of FIG. 1. Referring to FIG. 9, a flip-flop 200 includes an input interface 210 and first to sixth inverters 230 to 280.

The first to sixth inverters 230 to 280 are the same as the first to sixth inverters 130 to 180 described with reference to FIG. 1, and a description thereof is thus omitted.

The input interface 210 inverts an input signal D in synchronization with the first and second clock signals n and b, and transfers the inverted input signal to the first inverter 130. The input interface 210 includes first to fourth input transistors 211 to 214. The first to fourth input transistors 211 to 214 are connected in series between the power node and the ground node. The first and second input transistors 211 and 212 may be P-type transistors, and the third and fourth input transistors 213 and 214 may be N-type transistors.

The input signal D is transferred to gates of the first and fourth input transistors 211 and 214. The second clock signal b is transferred to a gate of the second input transistor 212. The first clock signal n is transferred to a gate of the third input transistor 213. The input interface 210 may be implemented with a 3-state inverter that operates in synchronization with the first and second clock signals n and b. A node between the second and third input transistors 212 and 213 may be an output of the input interface 210. The output of the input interface 210 is connected to an input of the first inverter 230.

In FIG. 9, the input interface 210 and the second inverter 240 have the same structure and connection as the third and fifth inverters 250 and 270 except for the first and second clock signals n and b. Accordingly, through mutual exchange of contacts for transferring the first and second clock signals n and b, the input interface 210 and the second inverter 240 may be implemented as illustrated in FIG. 3, 5 or 7. Also, as illustrated in FIG. 4, 6 or 8, the first inverter 230 may share the power supply voltage VDD and the ground voltage VSS with the input interface 210 and the second inverter 240.

If the input interface 210 and the second inverter 240 are implemented as illustrated in FIG. 3, 5 or 7, and the third and fifth inverters 250 and 270 are implemented as illustrated in FIG. 3, 5 or 7, the layout efficiency of the flip-flop 200 may be further improved, and the size of the flip-flop 200 may be further reduced.

Figure 10:
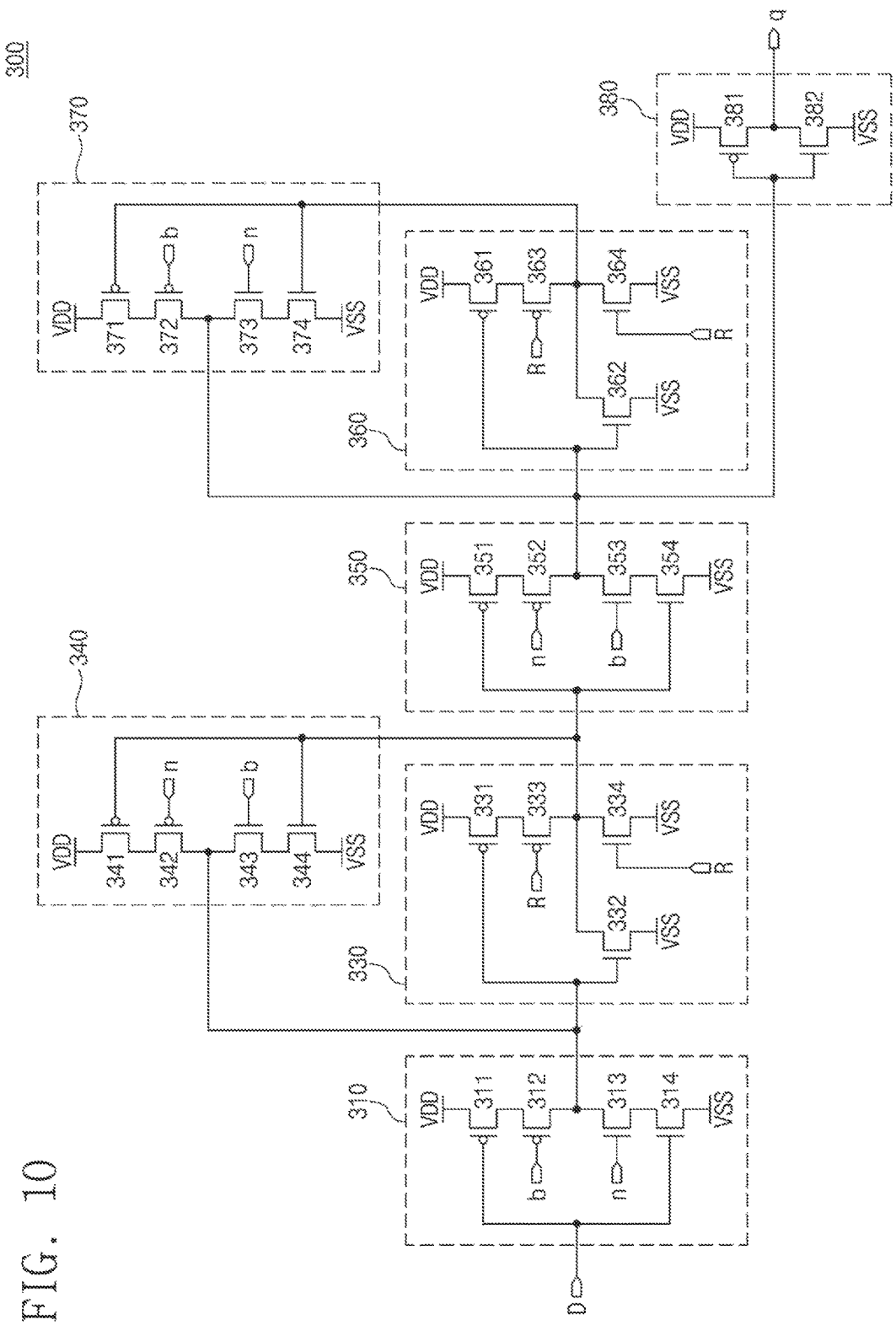
FIG. 10 illustrates an application example of the flip-flop of FIG. 9.

FIG. 10 illustrates an application example of the flip-flop 200 of FIG. 9. Referring to FIG. 10, a flip-flop 300 includes an input interface 310 and first to sixth inverters 330 to 380.

The input interface 310 and the second, third, fifth and sixth inverters 340, 350, 370 and 380 are configured the same as the input interface 210 and the second, third, fifth and sixth inverters 240, 250, 270 and 280 of FIG. 9, and a description thereof is thus omitted.

The first inverter 330 includes 1_1st to 1_4th transistors 331 to 334. The 1_1st and 1_3rd transistors 331 and 333 are connected in series between the power node supplied with the power supply voltage VDD and the 1_4th transistor 334. The 1_1st and 1_3rd transistors 331 and 333 may be of a P-type. The 1_2nd and 1_4th transistors 332 and 334 are connected in parallel between the ground node supplied with the ground voltage VSS and the 1_3rd transistor 333. The 1_2nd and 1_4th transistors 332 and 334 may be of an N-type.

An output of the input interface 310 is transferred to gates of the 1_1st and 1_3rd transistors 331 and 332. A reset signal "R" is transferred to gates of the 1_3rd and 1_4th transistors 333 and 334. If the reset signal "R" is activated, that is, if the reset signal "R" has the power supply voltage VDD or a voltage similar in level to the power supply voltage VDD, a node between the 1_3rd and 1_4th transistors 333 and 334 may be reset with the ground voltage VSS. If the reset signal "R" is deactivated, that is, if the reset signal "R" has the ground voltage VSS or a voltage similar in level to the ground voltage VSS, the 1_3rd transistor 333 may maintain a turn-on state. The 1_1st and 1_2nd transistors 331 and 332 may operate as an inverter.

The fourth inverter 360 includes 4_1st to 4_4th transistors 361 to 364. The 4_1st and 4_3rd transistors 361 and 363 are connected in series between the power node supplied with the power supply voltage VDD and the 4_4th transistor 364. The 4_1st and 4_3rd transistors 361 and 363 may be of a P-type. The 4_2nd and 4_4th transistors 362 and 364 are connected in parallel between the ground node supplied with the ground voltage VSS and the 4_3rd transistor 363. The 4_2nd and 4_4th transistors 362 and 364 may be of an N-type.

An output of the third inverter 350 is transferred to gates of the 4_1st and 4_2nd transistors 361 and 362. The reset signal "R" is transferred to gates of the 4_3rd and 4_4th transistors 363 and 364. If the reset signal "R" is activated, a node between the 4_3rd and 4_4th transistors 363 and 364 may be reset with the ground voltage VSS. If the reset signal "R" is deactivated, the 4_3rd transistor 363 may maintain a turn-on state. The 4_1st and 4_2nd transistors 361 and 362 may operate as an inverter.

Figure 11:
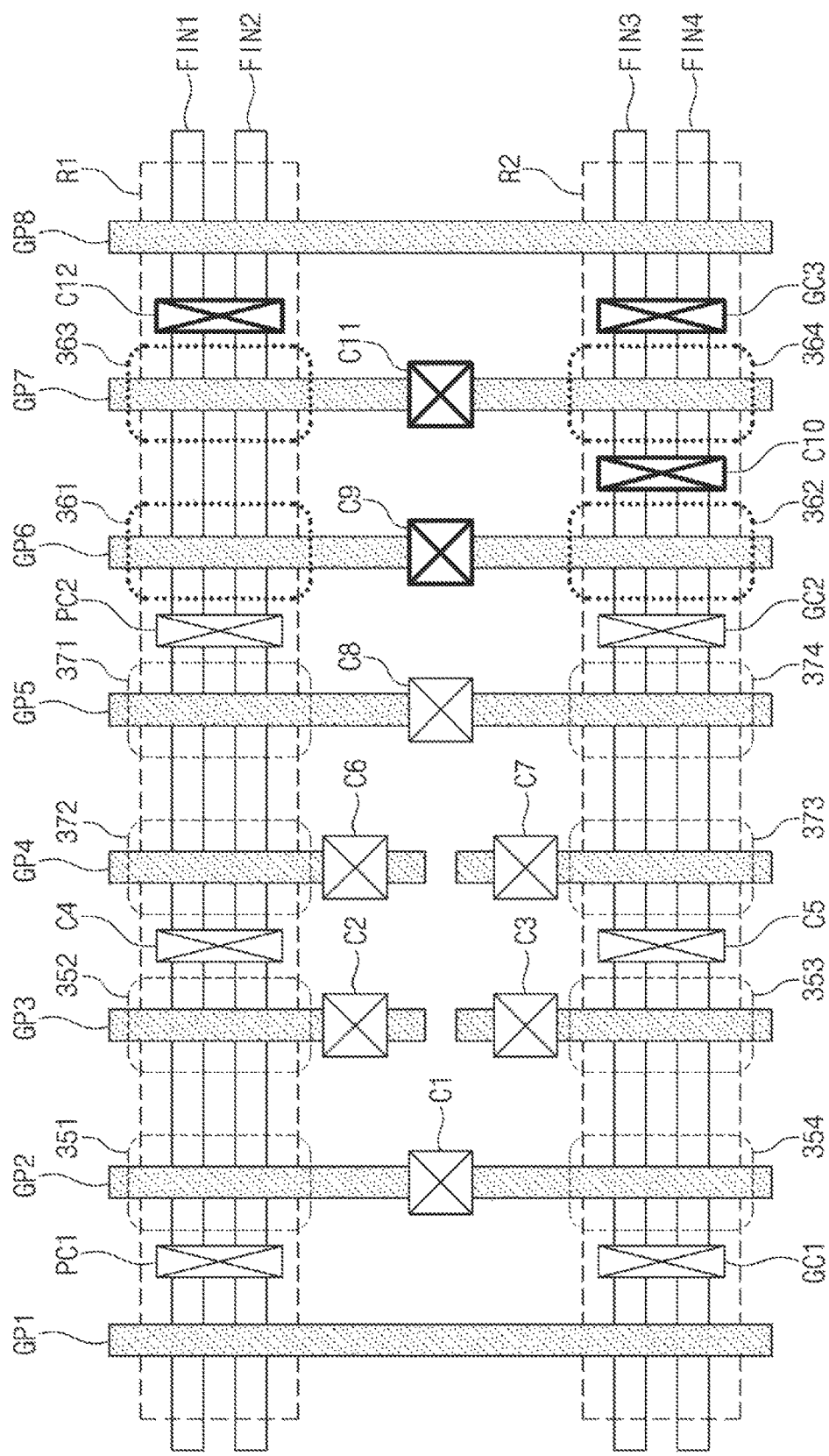
FIG. 11 illustrates an example in which the fourth inverter of FIG. 10 shares the power supply voltage and the ground voltage with the third and fifth inverters.

FIG. 11 illustrates an example in which the fourth inverter 360 of FIG. 10 shares the power supply voltage VDD and the ground voltage VSS with the third and fifth inverters 350 and 370. Referring to FIGS. 3 and 11, the arrangement of the 3_1st to 3_4th transistors 351 to 354 and the 5_1st to 5_4th transistors 371 to 374 is the same as the arrangement of the 3_1st to 3_4th transistors 151 to 154 and the 5_1st to 5_4th transistors 171 to 174, and a description thereof is thus omitted.

Compared with FIG. 3, the seventh and eighth gate patterns GP7 and GP8 are added in FIG. 11. The sixth gate pattern GP6 may form the 4_1st transistor 361 together with portions of the first active area R1 which are adjacent to the sixth gate pattern GP6, and may form the 4_2nd transistor 362 together with portions of the second active area R2 which are adjacent to the sixth gate pattern GP6. The 4_1st transistor 361 may receive the power supply voltage VDD from the second power contact PC2. The 4_2nd transistor 362 may receive the ground voltage VSS from the second ground contact GC2.

A ninth contact C9 may be provided in the sixth gate pattern GP6 of the 4_1st and 4_2nd transistors 361 and 362. The ninth contact C9 may extend in a direction perpendicular to the first and second active areas R1 and R2, and may be connected with a wiring over the first and second active areas R1 and R2. The ninth contact C9 may correspond to an input of the fourth inverter 360.

The seventh gate pattern GP7 may form the 4_3rd transistor 363 together with portions of the first active area R1 which are adjacent to the seventh gate pattern GP7, and may form the 4_4th transistor 364 together with portions of the second active area R2 which are adjacent to the seventh gate pattern GP7. The eleventh contact C11 may be provided in the seventh gate pattern GP7 of the 4_3rd and 4_4th transistors 363 and 364. The eleventh contact C11 may extend in a direction perpendicular to the first and second active areas R1 and R2, and may be connected with a wiring over the first and second active areas R1 and R2. The eleventh contact C11 may transfer the reset signal "R" to the 4_3rd and 4_4th transistors 363 and 364.

In the second active area R2, a third contact GC3 may be provided between the seventh and eighth gate patterns GP7 and GP8. The third contact GC3 may extend in a direction perpendicular to the first and second active areas R1 and R2, and may be connected with a wiring over the first and second active areas R1 and R2. The 4_2nd transistor 364 may receive the ground voltage VSS from the third ground contact GC3.

In the second active area R2, the tenth contact C10 may be provided between the sixth and seventh gate patterns GP6 and GP7. In the first active area R1, a twelfth contact C12 may be provided between the seventh and eighth gate patterns GP7 and GP8. The tenth and twelfth contacts C10 and C12 may extend in a direction perpendicular to the first and second active areas R1 and R2, and may be connected in common over the first and second active areas R1 and R2. The tenth and twelfth contacts C10 and C12 may correspond to an output of the fourth inverter 360.

The fourth inverter 360 illustrated in FIG. 11 is an example. As described with reference to FIG. 4, the fourth inverter 360 or the sixth inverter 380 may be disposed to share the power supply voltage VDD and the ground voltage VSS with the third inverter 350 or the fifth inverter 370.

The input interface 310 and the first and second inverters 330 and 340 may be also implemented as illustrated in FIG. 11. For example, the sixth gate pattern GP6 may form the 1_1st transistor 331 together with portions of the first active area R1 which are adjacent to the sixth gate pattern GP6, and may form the 1_2nd transistor 332 together with portions of the second active area R2 which are adjacent to the sixth gate pattern GP6. The ninth contact C9 may transfer the input signal D. The seventh gate pattern GP7 may form the 1_3rd transistor 333 together with portions of the first active area R1 which are adjacent to the seventh gate pattern GP7, and may form the 1_4th transistor 334 together with portions of the second active area R2 which are adjacent to the seventh gate pattern GP7. The eleventh contact C11 may transfer the reset signal "R". Portions that are not set forth above may be configured the same as described with reference to the third to fifth inverters 350 to 370.

Figure 12:
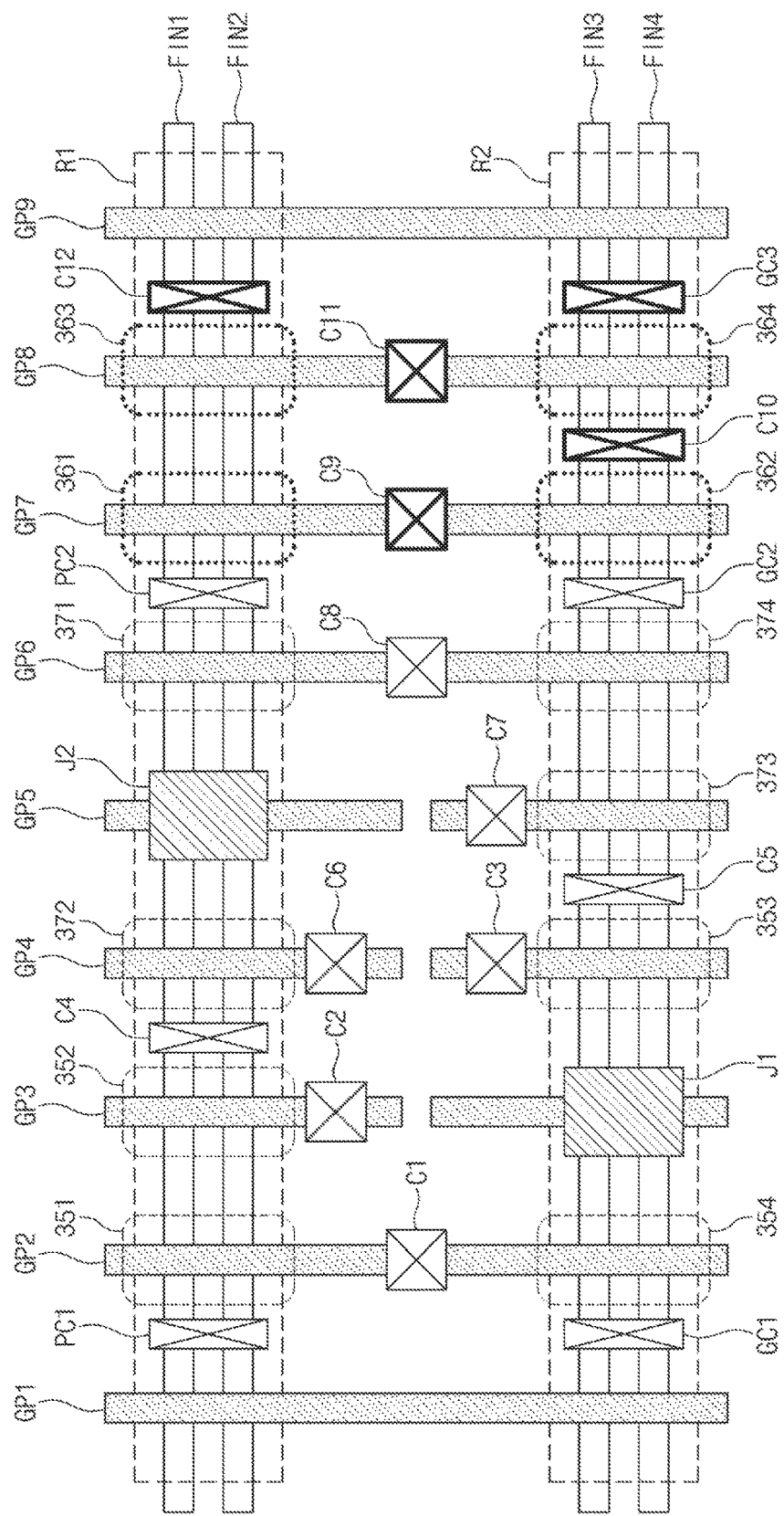
FIG. 12 illustrates an application example of arrangement of the third to fifth inverters of FIG. 11.

FIG. 12 illustrates an application example of arrangement of the third to fifth inverters 350 to 370 of FIG. 11. Referring to FIG. 12, the arrangement of the 3_1st to 3_4th transistors 351 to 354 and the 5_1st to 5_4th transistors 371 to 374 may be the same as illustrated in FIG. 5. Compared with FIG. 5, the eighth and ninth gate patterns GP8 and GP9 are added in FIG. 12.

The seventh to ninth gate patterns GP7 to GP9 may correspond to the sixth to eighth gate patterns GP6 to GP8 of FIG. 11, respectively. For example, the seventh gate pattern GP7 may be used to form the 4_1st and 4_2nd transistors 361 and 362. The eighth gate pattern GP8 may be used to form the 4_3rd and 4_4th transistors 363 and 364.

The fourth inverter 360 illustrated in FIG. 12 is an example. As described with reference to FIG. 4, the fourth inverter 360 or the sixth inverter 380 may be disposed to share the power supply voltage VDD and the ground voltage VSS with the third inverter 350 or the fifth inverter 370.

The input interface 310 and the first and second inverters 330 and 340 may be also implemented as illustrated in FIG. 12. For example, the seventh gate pattern GP7 may form the 1_1st transistor 331 together with portions of the first active area R1 which are adjacent to the seventh gate pattern GP7, and may form the 1_2nd transistor 332 together with portions of the second active area R2 which are adjacent to the seventh gate pattern GP7. The ninth contact C9 may transfer the input signal D. The eighth gate pattern GP8 may form the 1_3rd transistor 333 together with portions of the first active area R1 which are adjacent to the eighth gate pattern GP8, and may form the 1_4th transistor 334 together with portions of the second active area R2 which are adjacent to the eighth gate pattern GP8. The eleventh contact C11 may transfer the reset signal "R". Portions that are not set forth above may be configured the same as described with reference to the third to fifth inverters 350 to 370.

Figure 13:
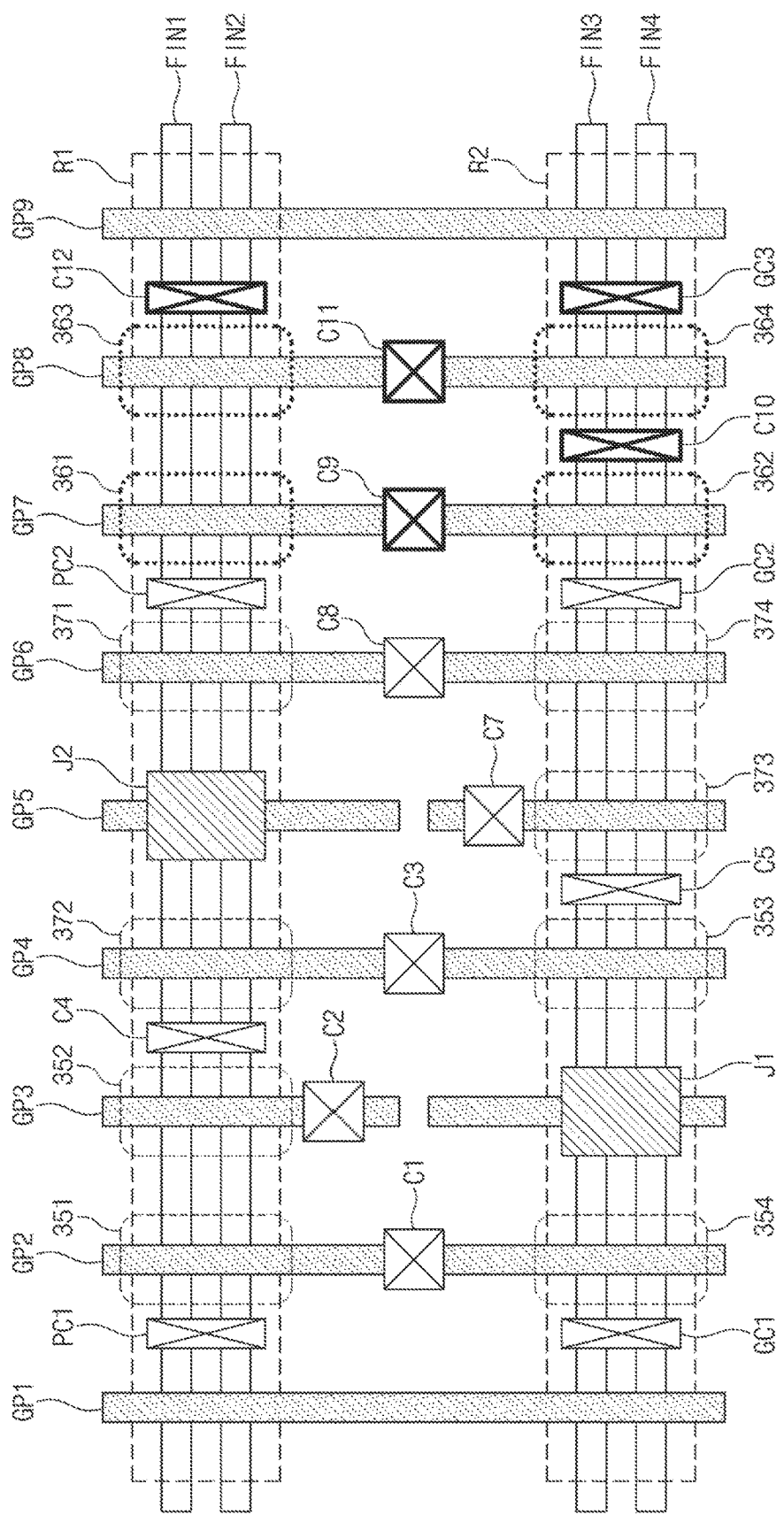
FIG. 13 illustrates another application example of arrangement of the third to fifth inverters of FIG. 11.

FIG. 13 illustrates another application example of arrangement of the third to fifth inverters 350 to 370 of FIG. 11. Referring to FIG. 13, the arrangement of the 3_1st to 3_4th transistors 351 to 354 and the 5_1st to 5_4th transistors 371 to 374 may be the same as illustrated in FIG. 7. Compared with FIG. 7, the eighth and ninth gate patterns GP8 and GP9 are added in FIG. 13.

The seventh to ninth gate patterns GP7 to GP9 may correspond to the sixth to eighth gate patterns GP6 to GP8 of FIG. 11, respectively. For example, the seventh gate pattern GP7 may be used to form the 4_1st and 4_2nd transistors 361 and 362. The eighth gate pattern GP8 may be used to form the 4_3rd and 4_4th transistors 363 and 364.

The fourth inverter 360 illustrated in FIG. 13 is an example. As described with reference to FIG. 4, the fourth inverter 360 or the sixth inverter 380 may be disposed to share the power supply voltage VDD and the ground voltage VSS with the third inverter 350 or the fifth inverter 370.

The input interface 310 and the first and second inverters 330 and 340 may be also implemented as illustrated in FIG. 13.

Figure 14:
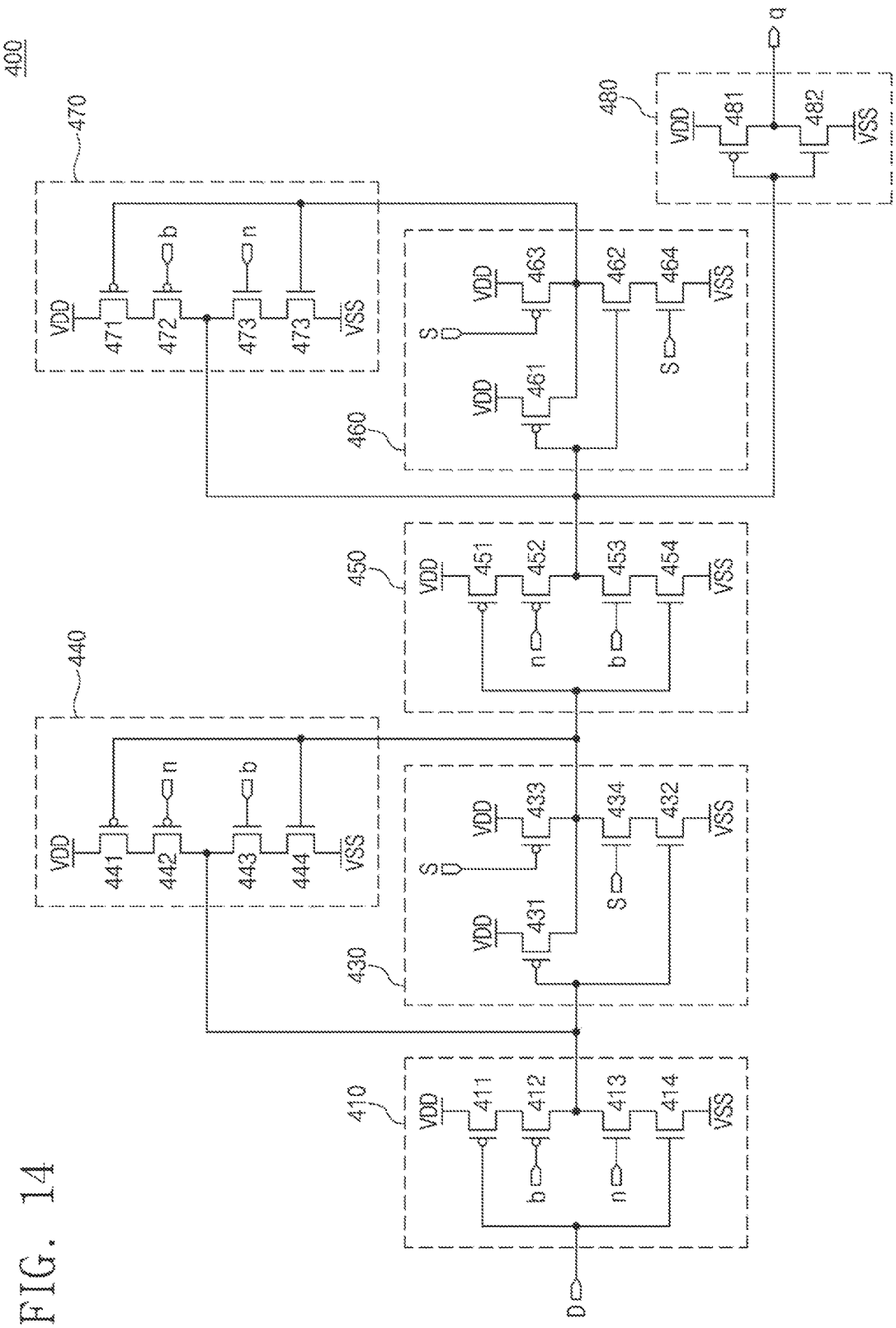
FIG. 14 illustrates another application example of the flip-flop of FIG. 9.

FIG. 14 illustrates another application example of the flip-flop 200 of FIG. 9. Referring to FIG. 14, a flip-flop 400 includes an input interface 410 and first to sixth inverters 430 to 480.

The input interface 410 and the second, third, fifth and sixth inverters 440, 450, 470, and 480 are configured the same as the input interface 210 and the second, third, fifth and sixth inverters 240, 250, 270 and 280 of FIG. 9, and a description thereof is thus omitted.

The first inverter 430 includes 1_1st to 1_4th transistors 331 to 334. The 1_1st and 1_3rd transistors 431 and 433 are connected in parallel between the power node supplied with the power supply voltage VDD and the 1_4th transistor 434. The 1_1st and 1_3rd transistors 431 and 433 may be of a P-type. The 1_2nd and 1_4th transistors 432 and 434 are connected in series between the ground node supplied with the ground voltage VSS and the 1_3rd transistor 433. The 1_2nd and 1_4th transistors 432 and 434 may be of an N-type.

An output of the input interface 410 is transferred to gates of the 1_1st and 1_2nd transistors 431 and 432. A set signal "S" is transferred to gates of the 1_3rd and 1_4th transistors 433 and 434. If the set signal "S" is activated, that is, if the set signal "S" has the ground voltage VSS or a voltage similar in level to the ground voltage VSS, a node between the 1_3rd and 1_4th transistors 433 and 434 may be set with the power supply voltage VDD. If the set signal "S" is deactivated, that is, if the set signal "S" has the power supply voltage VDD or a voltage similar in level to the power supply voltage VDD, the 1_4th transistor 434 may maintain a turn-on state. The 1_1st and 1_2nd transistors 431 and 432 may operate as an inverter.

The fourth inverter 460 includes 4_1st to 4_4th transistors 461 to 464. The 4_1st and 4_3rd transistors 461 and 463 are connected in parallel between the power node supplied with the power supply voltage VDD and the 4_2nd transistor 462. The 4_1st and 4_3rd transistors 461 and 463 may be of a P-type. The 4_2nd and 4_4th transistors 462 and 464 are connected in series between the ground node supplied with the ground voltage VSS and the 4_3rd transistor 463. The 4_2nd and 4_4th transistors 462 and 464 may be of an N-type.

An output of the third inverter 450 is transferred to gates of the 4_1st and 4_2nd transistors 461 and 462. The set signal "S" is transferred to gates of the 4_3rd and 4_4th transistors 463 and 464. If the set signal "S" is activated, a node between the 4_2nd and 4_3rd transistors 462 and 463 may be set with the power supply voltage VDD. If the set signal "S" is deactivated, the 4_4th transistor 464 may maintain a turn-on state. The 4_1st and 4_2nd transistors 461 and 462 may operate as an inverter.

Figure 15:
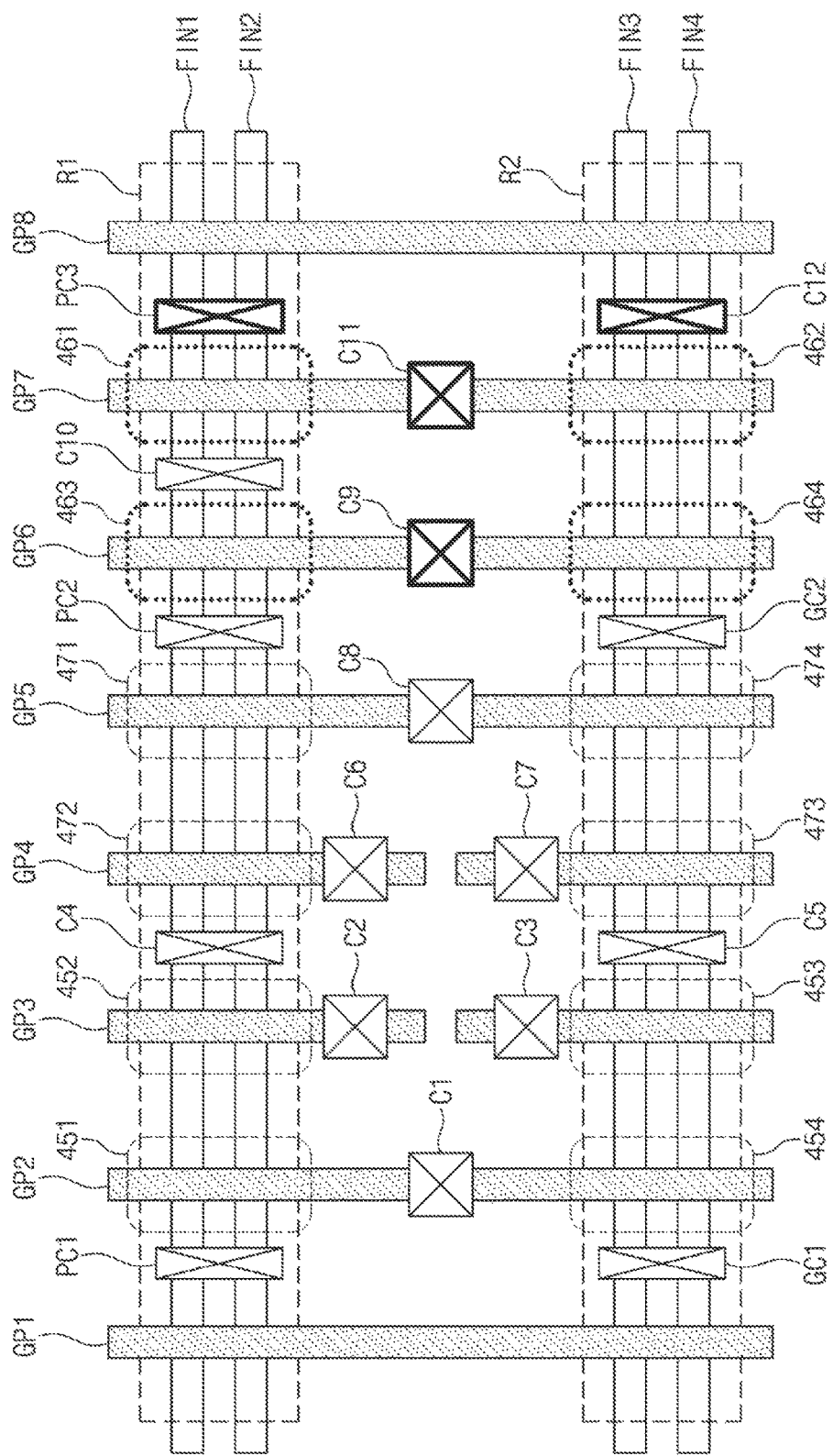
FIG. 15 illustrates an example in which the fourth inverter of FIG. 14 shares the power supply voltage and the ground voltage with the third and fifth inverters.

FIG. 15 illustrates an example in which the fourth inverter 460 of FIG. 14 shares the power supply voltage VDD and the ground voltage VSS with the third and fifth inverters 450 and 470. Referring to FIGS. 3 and 11, the arrangement of the 3_1st to 3_4th transistors 451 to 454 and the 5_1st to 5_4th transistors 471 to 474 is the same as the arrangement of the 3_1st to 3_4th transistors 151 to 154 and the 5_1st to 5_4th transistors 171 to 174, and a description thereof is thus omitted.

Compared with FIG. 3, the seventh and eighth gate patterns GP7 and GP8 are added in FIG. 11. The sixth gate pattern GP6 may form the 4_3rd transistor 463 together with portions of the first active area R1 which are adjacent to the sixth gate pattern GP6, and may form the 4_4th transistor 464 together with portions of the second active area R2 which are adjacent to the sixth gate pattern GP6. The 4_3rd transistor 463 may receive the power supply voltage VDD from the second power contact PC2. The 4_4th transistor 464 may receive the ground voltage VSS from the second ground contact GC2.

The ninth contact C9 may be provided in the sixth gate pattern GP6 of the 4_3rd and 4_4th transistors 463 and 464. The ninth contact C9 may extend in a direction perpendicular to the first and second active areas R1 and R2, and may be connected with a wiring over the first and second active areas R1 and R2. The ninth contact C9 may transfer the set signal "S" to the 4_3rd and 4_4th transistors 463 and 464.

The seventh gate pattern GP7 may form the 4_1st transistor 461 together with portions of the first active area R1 which are adjacent to the seventh gate pattern GP7, and may form the 4_2nd transistor 462 together with portions of the second active area R2 which are adjacent to the seventh gate pattern GP7. The eleventh contact C11 may be provided in the seventh gate pattern GP7 of the 4_1st and 4_2nd transistors 461 and 462. The eleventh contact C11 may extend in a direction perpendicular to the first and second active areas R1 and R2, and may be connected with a wiring over the first and second active areas R1 and R2. The eleventh contact C11 may correspond to an input of the fourth inverter 460.

In the first active area R1, the third power contact PC3 may be disposed between the seventh and eighth gate patterns GP7 and GP8. The third power contact PC3 may extend in a direction perpendicular to the first and second active areas R1 and R2, and may be connected with a wiring over the first and second active areas R1 and R2. The 4_1st transistor 461 may receive the power supply voltage VDD from the third power contact PC3.

In the first active area R1, the tenth contact C10 may be provided between the sixth and seventh gate patterns GP6 and GP7. In the second active area R2, the twelfth contact C12 may be provided between the seventh and eighth gate patterns GP7 and GP8. The tenth and twelfth contacts C10 and C12 may extend in a direction perpendicular to the first and second active areas R1 and R2, and may be connected in common over the first and second active areas R1 and R2. The tenth and twelfth contacts C10 and C12 may correspond to an output of the fourth inverter 460.

The fourth inverter 460 illustrated in FIG. 15 is an example. As described with reference to FIG. 4, the fourth inverter 460 or the sixth inverter 480 may be disposed to share the power supply voltage VDD and the ground voltage VSS with the third inverter 450 or the fifth inverter 470.

The input interface 410 and the first and second inverters 430 and 440 may be also implemented as illustrated in FIG. 15. For example, the sixth gate pattern GP6 may form the 1_3rd transistor 433 together with portions of the first active area R1 which are adjacent to the sixth gate pattern GP6, and may form the 1_4th transistor 434 together with portions of the second active area R2 which are adjacent to the sixth gate pattern GP6. The ninth contact C9 may transfer the set signal "S". The seventh gate pattern GP7 may form the 1_1st transistor 431 together with portions of the first active area R1 which are adjacent to the seventh gate pattern GP7, and may form the 1_2nd transistor 432 together with portions of the second active area R2 which are adjacent to the seventh gate pattern GP7. The eleventh contact C11 may transfer the input signal D. Portions that are not set forth above may be configured the same as described with reference to the third to fifth inverters 450 to 470.

Figure 16:
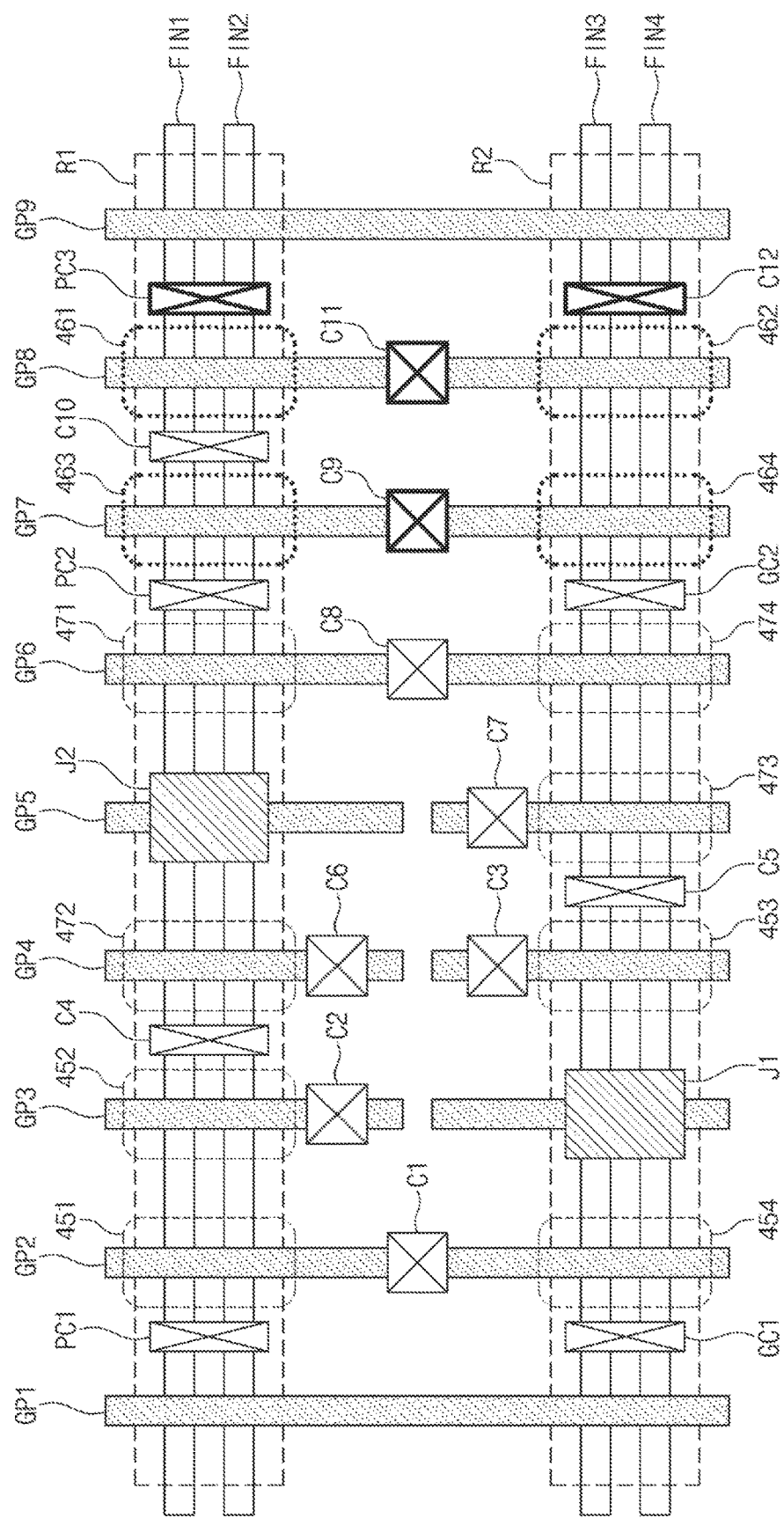
FIG. 16 illustrates an application example of arrangement of the third to fifth inverters of FIG. 15.

FIG. 16 illustrates an application example of arrangement of the third to fifth inverters 450 to 470 of FIG. 15. Referring to FIG. 16, the arrangement of the 3_1st to 3_4th transistors 451 to 454 and the 5_1st to 5_4th transistors 471 to 474 may be the same as illustrated in FIG. 5. Compared with FIG. 5, the eighth and ninth gate patterns GP8 and GP9 are added in FIG. 16.

The seventh to ninth gate patterns GP7 to GP9 may correspond to the sixth to eighth gate patterns GP6 to GP8 of FIG. 15, respectively. For example, the seventh gate pattern GP7 may be used to form the 4_3rd and 4_4th transistors 463 and 464. The eighth gate pattern GP8 may be used to form the 4_1st and 4_2nd transistors 461 and 462.

The fourth inverter 460 illustrated in FIG. 16 is an example. As described with reference to FIG. 4, the fourth inverter 460 or the sixth inverter 480 may be disposed to share the power supply voltage VDD and the ground voltage VSS with the third inverter 450 or the fifth inverter 470.

The input interface 410 and the first and second inverters 430 and 440 may be also implemented as illustrated in FIG. 16. For example, the seventh gate pattern GP7 may form the 1_3rd transistor 433 together with portions of the first active area R1 which are adjacent to the seventh gate pattern GP7, and may form the 1_4th transistor 434 together with portions of the second active area R2 which are adjacent to the seventh gate pattern GP7. The ninth contact C9 may transfer the set signal "S". The eighth gate pattern GP8 may form the 1_1st transistor 431 together with portions of the first active area R1 which are adjacent to the eighth gate pattern GP8, and may form the 1_2nd transistor 432 together with portions of the second active area R2 which are adjacent to the eighth gate pattern GP8. The eleventh contact C11 may transfer the input signal D.

Figure 17:
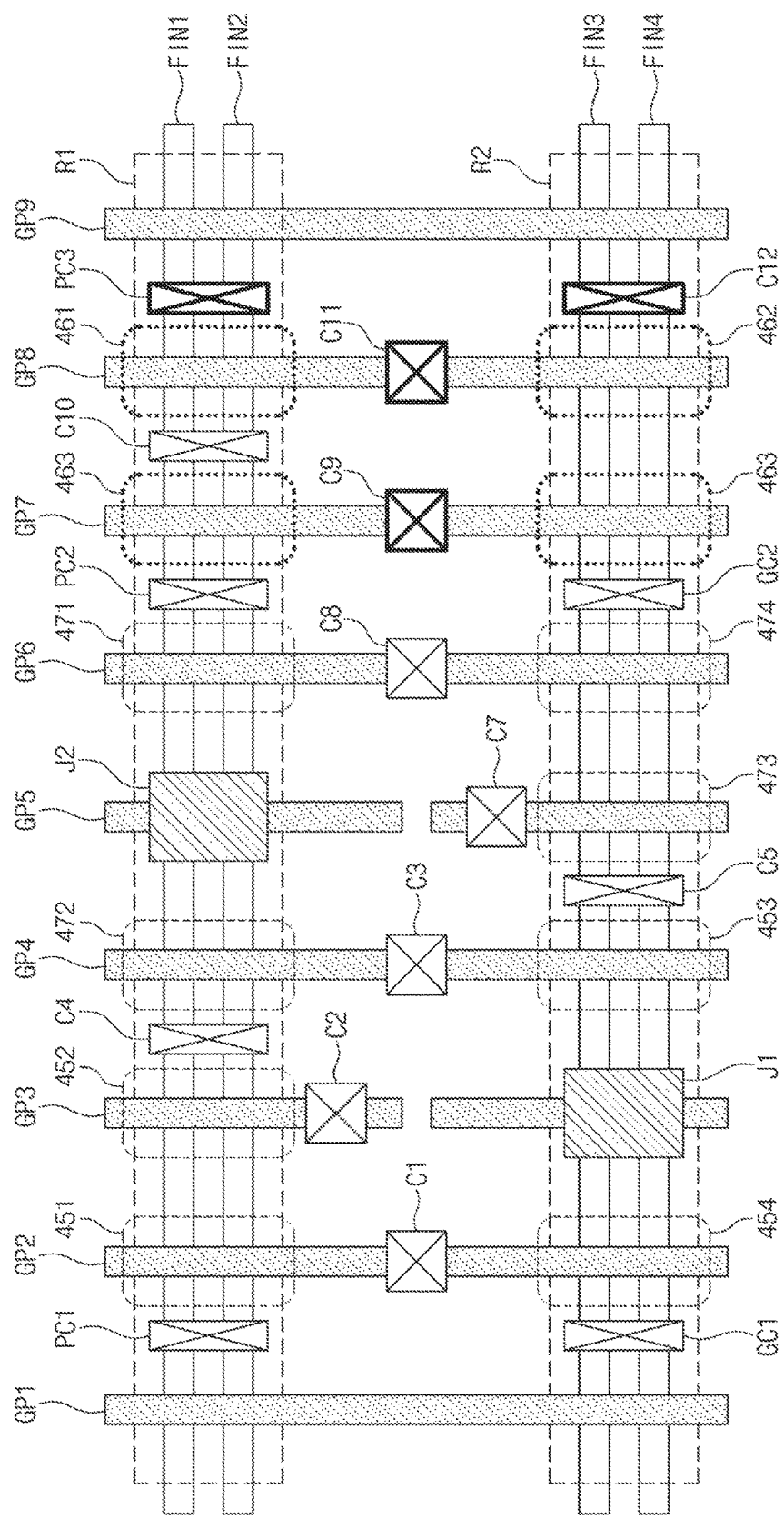
FIG. 17 illustrates another application example of arrangement of the third to fifth inverters of FIG. 15.

FIG. 17 illustrates another application example of arrangement of the third to fifth inverters 450 to 470 of FIG. 15. Referring to FIG. 17, the arrangement of the 3_1st to 3_4th transistors 451 to 454 and the 5_1st to 5_4th transistors 471 to 474 may be the same as illustrated in FIG. 7. Compared with FIG. 7, the eighth and ninth gate patterns GP8 and GP9 are added in FIG. 17.

The seventh to ninth gate patterns GP7 to GP9 may correspond to the sixth to eighth gate patterns GP6 to GP8 of FIG. 15, respectively. For example, the seventh gate pattern GP7 may be used to form the 4_3rd and 4_4th transistors 463 and 464. The eighth gate pattern GP8 may be used to form the 4_1st and 4_2nd transistors 461 and 462.

The fourth inverter 460 illustrated in FIG. 17 is an example. As described with reference to FIG. 4, the fourth inverter 460 or the sixth inverter 480 may be disposed to share the power supply voltage VDD and the ground voltage VSS with the third inverter 450 or the fifth inverter 470.

The input interface 410 and the first and second inverters 430 and 440 may be also implemented as illustrated in FIG. 17.

According to an example embodiment of the inventive concept, a 3-state inverter is disposed between a master latch and a slave latch of a flip-flop. Since a taper is removed in a layout of the flip-flop, the flip-flop capable of preventing deterioration in a characteristic and a decrease in yield is provided. The 3-state inverter is disposed between two power contacts and ground contacts together with one inverter of the slave latch. Since the power contacts and the ground contacts are shared with any other elements, the flip-flop having improved layout efficiency is provided.

While the inventive concept has been described with reference to example embodiments, it will be apparent to those skilled in the art that various changes and modifications may be made without departing from the spirit and scope of the inventive concept. Therefore, it should be understood that the above example embodiments are not limiting, but illustrative.

What is claimed is:

1. A flip-flop comprising:
   an input interface configured to receive a first signal, and output the received first signal as a second signal in synchronization with a clock;
   a first latch comprising a first inverter and a second inverter, and configured to store the second signal output from the input interface in synchronization with the clock;
   a third inverter configured to output the second signal stored in the first latch as a third signal in synchronization with the clock; and
   a second latch comprising a fourth inverter and a fifth inverter, and configured to store the third signal output from the third inverter in synchronization with the clock,
   wherein the third inverter and the fifth inverter comprise:
   first transistors of a first type formed between a first power contact and a second power contact supplied with a power supply voltage on first-type fins; and
   second transistors of a second type formed between a first ground contact and a second ground contact supplied with a ground voltage on second-type fins.

2. The flip-flop of claim 1, wherein another power contact is not disposed between the first power contact and the second power contact on the first-type fins, and
   wherein another ground contact is not disposed between the first ground contact and the second ground contact on the second-type fins.

3. The flip-flop of claim 1, wherein first, second, third, and fourth gates are disposed between the first power contact and the second power contact on the first-type fins,
   wherein fifth, sixth, seventh, and eighth gates are disposed between the first ground contact and the second ground contact on the second-type fins,
   wherein the first gate is connected with the fifth gate, and wherein the fourth gate is connected with the eighth gate.

4. The flip-flop of claim 3, wherein an output of the first latch is connected with the first gate, and
   wherein an output of the fourth inverter is connected with the fourth gate.

5. The flip-flop of claim 3, wherein the clock comprises a first clock and a second clock,
   wherein the first clock is supplied to the second gate and the seventh gate, and
   wherein the second clock is supplied to the third gate and the sixth gate.

6. The flip-flop of claim 3, wherein a ninth gate is disposed adjacent to the second power contact and the second ground contact,
   wherein the second power contact is located between the fourth gate and the ninth gate on the first-type fins,
   wherein the second ground contact is located between the eighth gate and the ninth gate on the second-type fins, and wherein the ninth gate forms the fourth inverter together with the first-type fins and the second-type fins.

7. The flip-flop of claim 6, wherein a portion of the first-type fins, which is adjacent to the ninth gate and opposite to the second power contact, and a portion of the second-type fins, which is adjacent to the ninth gate and opposite to the second ground contact are connected with the eighth gate.

8. The flip-flop of claim 3, further comprising:
a sixth inverter configured to invert the third signal and output the inverted third signal as a fourth signal,
wherein a ninth gate is disposed adjacent to the second power contact and the second ground contact,
wherein the second power contact is located between the fourth gate and the ninth gate on the first-type fins,
wherein the second ground contact is located between the eighth gate and the ninth gate on the second-type fins, and
wherein the ninth gate forms the sixth inverter together with the first-type fins and the second-type fins.

9. The flip-flop of claim 3, wherein ninth and tenth gates are disposed adjacent to the second power contact and the second ground contact,
wherein the second power contact is located between the fourth gate and the ninth gate on the first-type fins,
wherein the second ground contact is located between the eighth gate and the ninth gate on the second-type fins,
wherein a reset signal is supplied to the tenth gate,
wherein an output of the third inverter is supplied to the ninth gate,
wherein the first-type fins of a side of the tenth gate are connected with the eighth gate,
wherein a third ground contact supplied with a ground voltage is disposed on the second-type fins of the side of the tenth gate, and
wherein the second-type fins between the ninth gate and the tenth gate are connected with the eighth gate.

10. The flip-flop of claim 3, wherein ninth and tenth gates are disposed adjacent to the second power contact and the second ground contact,
wherein the second power contact is located between the fourth gate and the ninth gate on the first-type fins,
wherein the second ground contact is located between the eighth gate and the ninth gate on the second-type fins,
wherein a set signal is supplied to the ninth gate,
wherein an output of the third inverter is supplied to the tenth gate,
wherein a third power contact supplied with a power supply voltage is disposed on the first-type fins of a side of the tenth gate,
wherein the second-type fins of the side of the tenth gate are connected with the eighth gate, and
wherein the first-type fins between the ninth gate and the tenth gate are connected with the eighth gate.

11. The flip-flop of claim 1, wherein first, second, third, fourth, and fifth gates are disposed between the first power contact and the second power contact,
wherein sixth, seventh, eighth, ninth, and tenth gates are disposed between the first ground contact and the second ground contact,
wherein the first gate is connected with the sixth gate,
wherein the fifth gate is connected with the tenth gate,
wherein an output of the first latch is connected with the first gate,
wherein an output of the fourth inverter is connected with the fifth gate,
wherein the clock comprises a first clock and a second clock,
wherein the first clock is supplied to the second gate and the ninth gate, and
wherein the second clock is supplied to the third gate and the eighth gate.

12. The flip-flop of claim 11, wherein a first jumper, which electrically connects the first-type fins separated by the fourth gate, is disposed over the fourth gate, and
wherein a second jumper, which electrically connects the second-type fins separated by the seventh gate, is disposed over the seventh gates.

13. The flip-flop of claim 11, wherein the third gate and the ninth gate are connected to each other.

14. The flip-flop of claim 1, wherein a power supply voltage of at least one of the first power contact and the second power contact and a ground voltage of at least one of the first ground contact and the second ground contact are shared with another element.

15. The flip-flop of claim 1, wherein the input interface comprises a sixth inverter configured to output the second signal in synchronization with the clock,
wherein the second inverter and the sixth inverter comprise:
third transistors of the first type formed between a third power contact and a fourth power contact supplied with the power supply voltage on the first-type fins; and
fourth transistors of the second type formed between a third ground contact and a fourth ground contact supplied with the ground voltage on the second-type fins.

16. The flip-flop of claim 15, wherein first, second, third, and fourth gates are disposed between the third power contact and the fourth power contact on the first-type fins,
wherein fifth, sixth, seventh, and eighth gates are disposed between the third ground contact and the fourth ground contact on the second-type fins,
wherein the first gate is connected with the fifth gate, and
wherein the fourth gate is connected with the eighth gate.

17. The flip-flop of claim 16, wherein ninth and tenth gates are disposed adjacent to the fourth power contact and the fourth ground contact,
wherein the fourth power contact is located between the fourth gate and the ninth gate on the first-type fins,
wherein the fourth ground contact is located between the eighth gate and the ninth gate on the second-type fins,
wherein an output of the third inverter is supplied to the ninth gate,
wherein a reset signal is supplied to the tenth gate,
wherein the first-type fins of a side of the tenth gate are connected with the eighth gate,
wherein a fifth ground contact supplied with the ground voltage is disposed on the second-type fins of the side of the tenth gate, and
wherein the second-type fins between the ninth gate and the tenth gate are connected with the eighth gate.

18. The flip-flop of claim 16, wherein ninth and tenth gates are disposed adjacent to the fourth power contact and the fourth ground contact,
wherein the fourth power contact is located between the fourth gate and the ninth gate on the first-type fins,
wherein the fourth ground contact is located between the eighth gate and the ninth gate on the second-type fins,
wherein an output of the third inverter is supplied to the tenth gate,
wherein a set signal is supplied to the ninth gate, wherein a fifth power contact supplied with the power supply voltage is disposed on the first-type fins of a side of the tenth gate, wherein the second-type fins of the side of the tenth gate are connected with the eighth gate, and wherein the first-type fins between the ninth gate and the tenth gate are connected with the eighth gate.

19. A flip-flop of claim 1 further comprising:
a sixth inverter configured to invert and output a signal output from a node between the third inverter and the second latch,
wherein a power supply voltage of at least one of the first power contact and the second power contact and a ground voltage of at least one of the first ground contact and the second ground contact are shared with one of the fourth inverter and the sixth inverter.

20. A flip-flop comprising:
an input interface configured to receive a first signal, and output the received first signal as a second signal in synchronization with a clock;
a first latch comprising a first inverter and a second inverter, and configured to store the second signal output from the input interface in synchronization with the clock;
a third inverter configured to output the second signal stored in the first inverter as a third signal in synchronization with the clock;
a second latch comprising a fourth inverter and a fifth inverter, and configured to store the third signal output from the third inverter in synchronization with the clock; and
a sixth inverter configured to invert the third signal and output the inverted third signal as a fourth signal,
wherein the third inverter includes first and second P-type metal-oxide-semiconductor (PMOS) transistors and first and second N-type metal-oxide-semiconductor (NMOS) transistors,
wherein the fifth inverter includes third and fourth PMOS transistors and third and fourth NMOS transistors,
wherein the first to fourth PMOS transistors are disposed between a first power contact and a second power contact supplied with a power supply voltage on first-type fins; and
wherein the first to fourth NMOS transistors are disposed between a first ground contact and a second ground contact supplied with a ground voltage on second-type fins.

* * * * *